United States Patent [19]

Acampora

[11] Patent Number: 4,897,855
[45] Date of Patent: Jan. 30, 1990

[54] DPCM SYSTEM WITH ADAPTIVE QUANTIZER HAVING UNCHANGING BIN NUMBER ENSEMBLE

[75] Inventor: Alfonse A. Acampora, Staten Island, N.Y.

[73] Assignee: General Electric Company, Schenectady, N.Y.

[21] Appl. No.: 127,335

[22] Filed: Dec. 1, 1987

[51] Int. Cl.[4] .................. H04B 1/10; H04B 14/04
[52] U.S. Cl. .................... 375/27; 358/135; 358/136
[58] Field of Search .............. 375/27, 118, 122, 30; 370/108; 358/133, 135, 136; 382/43, 50, 56; 369/60

[56] References Cited

U.S. PATENT DOCUMENTS

| 3,403,226 | 9/1968 | Wintringham | 358/133 |
| 4,023,199 | 5/1977 | Netravali et al. | 358/13 |
| 4,051,530 | 9/1977 | Kuroda et al. | 358/136 |
| 4,077,053 | 2/1978 | Ishiguro | 358/136 |
| 4,093,962 | 6/1978 | Ishiguro et al. | 358/135 |
| 4,200,886 | 4/1980 | Musmann et al. | 358/135 |
| 4,202,011 | 5/1980 | Koga | 356/136 |
| 4,371,895 | 2/1983 | Koga | 358/136 |
| 4,460,923 | 7/1984 | Hirano et al. | 356/136 |
| 4,470,146 | 9/1984 | Yatsuzuka et al. | 375/27 |
| 4,541,012 | 9/1985 | Tescher | 358/133 |
| 4,562,468 | 12/1985 | Koga | 358/136 |
| 4,573,167 | 2/1986 | Hentschke et al. | 358/135 |
| 4,583,114 | 4/1986 | Catros | 358/135 |
| 4,592,070 | 5/1986 | Chow et al. | 375/27 |
| 4,691,233 | 9/1987 | Acampora | 375/27 |
| 4,700,226 | 10/1987 | Acampora | 375/27 |
| 4,706,260 | 11/1987 | Fedele et al. | 358/133 |

OTHER PUBLICATIONS

"On Quantizers for DPCM Coding of Picture Signals" by Netravali, published at pp. 360–370 of IEEE Transactions in Information Theory, May 1977.

"Picture Coding: A Review" by Netravali, published in Proceedings of the IEEE, vol. 68, No. 3, Mar. 1980, p. 389.

Primary Examiner—Robert L. Griffin
Assistant Examiner—Stephen Chin
Attorney, Agent, or Firm—William Squire; James C. Davis, Jr.; Paul R. Webb, II

[57] ABSTRACT

Difference signals are coarsely quantized in a plurality of modes in a DPCM TV system. The fill and rate of fill of the transmitting rate buffer is monitored to prevent errors due to underflow and overflow of the transmitting rate buffer. The data rate is adaptively reduced in response to the rate of fill and fill by an adaptive coarse quantizer which is switched to a more coarse quantizing mode to reduce the transmit data rate. The coarse quantizing values are selected from among the members of the ensemble of values used for the least coarse quantizing mode. This avoids quantizer mode information having to be transmitted to the receiver and giving rise to additional transmitting overhead.

17 Claims, 11 Drawing Sheets

| FILL, PERCENT | I | II | III | IV | V | VI | VII | |
|---|---|---|---|---|---|---|---|---|
| 31-37 | 011111 | $Q_2$ | $Q_2$ $SD_2$ | $Q_2$ $SD_2$ | $Q_3$ $SD_2$ | $Q_3$ $SD_2$ $TD_2$ | $Q_3$ $SD_2$ $TD_2$ | A |
| 25-31 | 001111 | | $Q_2$ | $Q_2$ $SD_2$ | $Q_2$ $SD$ | $Q_3$ $SD_2$ | $Q_3$ $SD_2$ $TD_2$ | B |
| 19-25 | 000111 | | | $Q_2$ $SD_2$ | $Q_2$ $SD_2$ | $Q_2$ $SD_2$ | $Q_3$ $SD_2$ | C |
| 12-19 | 000011 | | | $Q_2$ | $Q_2$ | $Q_2$ $SD_2$ | $Q_2$ $SD_2$ | D |
| 6-12 | 000001 | | | | $Q_2$ | $Q_2$ | $Q_2$ $SD_2$ | E |
| 0-6 | 000000 | | | | | | $Q_2$ | F |
| | | 000000 | 000001 | 000011 | 000111 | 001111 | 011111 | G |
| | | 0-20 | 20-32 | 32-52 | 52-64 | 64-80 | 80-100 | |
| | | | | RATE, BYTES/LINE | | | | |

*Fig. 4a*

| FILL, PERCENT | 0-20 | 20-32 | 32-52 | 52-64 | 64-80 | 80-100 |
|---|---|---|---|---|---|---|
| 31-37 | $Q_2$ | $TD_2$ $Q_2$ | $TD_2$ $Q_2$ | $TD_2$ $Q_2$ | $TD_2$ $Q_2$ | $TD_2$ $Q_2$ |
| 25-31 |  | $Q_2$ | $TD_2$ $Q_2$ | $TD_2$ $Q_2$ | $TD_2$ $Q_2$ | $TD_2$ $Q_2$ |
| 19-25 |  |  | $TD_2$ $Q_2$ | $TD_2$ $Q_2$ | $TD_2$ $Q_2$ | $TD_2$ $Q_2$ |
| 12-19 |  |  | $Q_2$ | $Q_2$ | $TD_2$ $Q_2$ | $TD_2$ $Q_2$ |
| 6-12 |  |  |  | $Q_2$ | $Q_2$ | $TD_2$ $Q_2$ |
| 0-6 |  |  |  |  |  | $Q_2$ |

RATE, BYTES/LINE

*Fig. 4b*

DPCM SYSTEM WITH ADAPTIVE QUANTIZER HAVING UNCHANGING BIN NUMBER ENSEMBLE

This invention relates to differential pulse code modulation (DPCM) data rate reduction systems, and more particularly to such systems in which the coarse quantizer is adaptive.

Of interest is copending application Ser. No. 928,042 filed Nov. 7, 1986 entitled "DPCM System with Rate-of-Fill Control of Buffer Occupancy", in the name of N. Fedele and A. A. Acampora, now U.S. Pat. No. 4,706,260 and U.S. Pat. No. 4,691,233 and 4,700,226 issued to A. A. Acampora, all assigned to the assignee of the present invention.

BACKGROUND OF THE INVENTION

In low-rate digital video systems such as that for videoconferencing, DPCM is often employed to remove redundant information from the image. In DPCM, a prediction of the current (incoming) pixel is formed from other pixels. The prediction is then subtracted from the current pixel to form the difference pixel. The resultant difference image is then quantized and encoded for digital transmission at the lower data rate. There are numerous prediction schemes that have been suggested and implemented. Among them, the common ones are the temporal prediction and the spatial prediction. A temporal predictor is one in which the prediction is formed using pixels from the previous frame. A spatial predictor, on the other hand, uses only pixels from the current frame to form the prediction of the current pixel.

A transform coded system is described in U.S. Pat. No. 4,302,775 issued Nov. 24, 1981 to Widergren et al., in which the transform coefficients are compressed for each transform block depending upon the fill condition of a buffer for that block.

"Pixel" is often used to denote either the data word representing a pixel or the value of the data word by which a pixel is represented. The transmitter knows the value of the predicted pixel in a predictive coding system, because the transmitter includes a prediction circuit which is identical to the prediction circuit in the receiver which is producing the predicted pixel. The predicted pixel is often a corresponding pixel from a previous frame, or a weighted linear combination of pixels lying near the corresponding pixel of either the current or the previous frame. In this context, "near" means close physical proximity in the two-dimensional picture or raster of which the pixels are a part.

FIG. 1 illustrates a communication system using prior art DPCM predictive coding techniques. In FIG. 1, a transmitter 10 communicates by way of a narrow bandwidth data channel 30 with a receiver 38. Transmitter 10 receives a source 12 of frame-sequential, line-scanned analog television signals to be transmitted. The analog television signals are applied to an analog-to-digital converter (ADC) 14 in transmitter 10. ADC 14 samples the analog signals, quantizes them (represents the infinite range of values by a finite set of values), ordinarily into 256 levels, which is a fine enough division so that the eye cannot perceive the error in a displayed picture, and digitizes the finely quantized signals (represents each value of the set by a different digital number) to form finely quantized digital signals.

The digital signals produced by ADC 14 are applied to the noninverting (+) input of subtractor 16 which receives a predicted signal at its inverting (−) input terminal. The predicted signal applied to the inverting input terminal of the subtractor 16 is subtracted from the current value of the signal then being applied to the noninverting input terminal of adder 16 from conductor 15. A difference signal is generated at the output of subtractor 16. The difference signal is often known as an error signal. Since ADC 14 finely quantized the source signal, the difference signal at the output of subtractor 16 is also finely quantized.

While not essential to operation of predictive coding systems, a coarse quantizer 18 is often inserted after the output of subtractor 16 to coarsely quantize the difference signal into a number of "bins", which aids in reducing the data rate by restricting the number of possible levels transmitted over the channel to the receiver, and by increasing the length of zero runs. The bin is itself represented by a digital number, so the output of quantizer 18 is a quantized difference signal. Thus, the difference signal at the input of coarse quantizer 18 is finely quantized, while the output signal is coarsely quantized, if the degree of quantization is not specified.

The coarsely quantized error signal is applied to a predictor loop 20. A circuit 40 in the receiver 38 is a replica of loop 20 and regenerates each pixel to be displayed in succession from the signal transmitted over channel 30. Predictor loop 20 includes an adder 22 which adds to the error signal from quantizer 18 the delayed value of the predicted signal received from predictor and delay circuit 24. This produces a new predicted signal which is applied to circuit 24. Predictor and delay circuit 24 delays the new predicted signal for a predetermined length of time, and may perform other processing steps, The delay associated with predictor and delay circuit 24 may be one frame interval. With a delay duration of one frame interval, the intensity value of a pixel of a frame is generally expected to be the same as the value of the corresponding pixel of the preceding frame. For a still picture, this will be true for every pixel, and in a picture having some motion, it will be true for many pixels. The delayed predicted signal is also applied to the inverting input terminal of subtractor 16.

The coarse quantizer 18 causes all values of the finely quantized difference signal applied thereto to be coarsely quantized into "bins". That is, all finely quantized difference signals lying within a range of value or "bin" are processed by coarse quantizer 18 to produce a single coarsely quantized value. In effect, all values of finely quantized difference signals lying within the range of values defining a bin are treated as though they had only one value, namely the bin value. The bin value may be near the center of the range of finely quantized values defining the bin. The number of non-zero bins is often a power of 2 such as 16 or 32. In addition to these non-zero bins, there is a center or "coring" bin into which finely quantized difference signals having zero or near zero magnitude will fall, and which produce a coarsely quantized value of zero at the output of the quantizer. The designer expects that a large number, or all, of the finely quantized difference pixels will fall into this coring bin. When the finely quantized differences are at or near zero, this indicates that the predicted signal is a faithful representation of the image or picture currently to be transmitted.

For television signals, the arithmetic value of a pixel is represented by one of $2^8$ or 256 possible numbers, each separate possible value corresponding to a unique distribution of logic highs and logic lows on eight conductors. For example, the 8-bit digital word 10010010 represents the arithmetic value 146 which in turn represents a luminance for that pixel which is 146/256 of the maximum luminance. The result of the subtraction process is such that the resulting signal is represented by 9-bits, or 512 possible numbers. The coarse quantizer reduces the number of possible levels of the difference signal to a smaller value than 512, as for example 16 non-zero bins plus the coring bin.

Thus, all finely quantized difference pixel arithmetic values ranging from (for example) 0 to 5 are forced by the quantizer to fall into the coring bin (zero value of the coarsely quantized signal), and values ranging from 6 to 10 are forced into bin 1. Finely quantized difference pixel arithmetic values of negative sign are also assigned to bins of the coarsely quantized difference signal. Assuming there are only 16 non-zero bins in this example, they can be represented by as few as 4 conductors (4-bits). If 4-bit digital numbers are used to represent bins, the bin numbers are not actual arithmetic values, and cannot be applied directly to adder 22. The desire to process relatively small 4-bit "bin" numbers, coupled with the need to apply proper arithmetic values often results in an arrangement (not illustrated) in which the coarse quantizer has two output conductor sets, one set coupled to the circuit adder which has a large number of conductors or bits (such as nine) for representing actual arithmetic values, and the other set having fewer conductors or bits (3 or 4) for coupling the corresponding "bin" number to a "coder". The close relationship between the arithmetic value and the bin value is known to those in the art and described, for example, in U.S. Pat. No. 3,761,613 issued Sept. 25, 1973 to Limb. The description hereinafter assumes that the exemplary quantizer has a single output which produces arithmetic values in the form of parallel 9-bit difference signals, which are used by both the adder and the coder.

The coarsely quantized difference signal is applied to coder 26. Coder 26 encodes the coarsely quantized difference signals on conductor 19 in known fashion, as by run length coding by statistical coding such as Huffman coding or the like, or by run-length coding in combination with statistical coding. Run-length coding drastically reduces the number of bits which are required to be transmitted over the data channel by counting the number of successive pixels from the coarse quantizer 18 which are at zero value (which are in the coring bin). In the above example, finely quantized difference signal pixel amplitudes or values from 0 to 5 are in the first or coring bin, and are assumed to be near enough to the predicted value so that the coarsely quantized difference signal can be zero. If the prediction and delay circuit of the system is effective, and especially if there is little motion in the television scene, it produces a signal which is very similar to the signal currently to be transmitted, so both the finely and coarsely quantized differences are mostly zero. If there are long runs (for example, A pixels in length) of zero-value coarsely quantized differences, the run of A pixels can be represented by a single codeword which means "the current image is the same as the predicted image for these A pixels38 . Thus, one codeword of, say, 20 bits, can represent any number of 9-bit pixel difference values. If the run length is for example 100 pixels, the amount of data required to be transmitted to represent the image is reduced from 900 bits (9 bits per pixel X 100 pixels) to 20 bits (the number of bits in a representative maximum-length codeword). In addition to signals representing zero run lengths, signals representing the amplitudes of at least some coarsely quantized difference pixels must be sent over channel 30 to the receiver. Such amplitudes are often coded by Huffman coding, in which the frequency of occurrence of various amplitudes or bins is evaluated, and codewords are assigned to each amplitude, with the codewords being shorter for the more frequently-occurring values and longer for infrequently-occurring amplitudes.

The rate of generation of codewords is highly variable and depends upon the picture which is represented by the coarsely quantized difference signals being coded. In a still image, there will be very long runs of zero difference signals. Each very long run of zero values can be represented by a single codeword, which codeword can only be generated at the end of the run. If the image is highly variable, as when a transition occurs between two very different scenes, for example, where there is violent motion in a scene, or when the camera pans or zooms rapidly, there will be few long runs of zeroes, and many unlike amplitude values will occur, requiring frequent generation of relatively long Huffman codewords In order to eliminate the variability of the data rate, a rate buffer 28 is coupled to coder 26 for receiving or being laden (loaded) with coded difference data at a variable rate, for temporarily storing the coded difference data, and for applying the coded difference data at a constant rate through the channel 30 to a receiver 38. This type of buffer is often known as a first-in, first-out (FIFO) memory.

Receiver 38 receives coded difference data at a constant rate from channel 30, and stores the coded difference data in a rate buffer 48. Data is supplied therefrom as required to a decoder 46, which accepts the run length and Huffman-coded difference data at a variable rate, and decodes it into difference signals exactly corresponding to the coarsely quantized difference signals which were available at the transmitter 10 (except for transmission errors, which are not considered herein). The decoded difference signals are applied to an input terminal of an adder 42 of a predictor loop 40. Adder 42 adds together the decoded difference signal and the delayed predicted signal to produce a new predicted signal which is applied to a digital-to-analog converter (DAC) 54 for generating an analog signal, which is applied to a television display circuit 52 for display of the picture. The new predicted signal is also applied to predictor and delay circuit 44 which is identical to predictor and delay circuit 24 of transmitter 10. Since predictor and delay circuit 44 is identical to predictor and delay circuit 24, the new predicted signal on conductor 43 appears on conductor 45 after a corresponding delay, which in the example is one frame interval. The coarsely quantized difference signal of transmitter 10 and the signal on conductor 59 of receiver 38 are identical (except for a time lag due to the time required for transmission therebetween).

Predictive systems such as that illustrated in FIG. 1 can achieve very large reductions in data rate, especially on still pictures. However, when the picture has motion, the predicted signal may at times be most unlike the actual current value. When there is substantial motion in the television picture, the error signals tend to be large in value and to change rapidly. Run length coding tends to be relatively less effective in reducing data rate, and Huffman coding tends to produce relatively longer code words. Since the data rate of channel 30 is preestabished and rate buffer 28 of transmitter 10 can only transmit data at the maximum rate allowed by channel 30, it is possible for rate buffer 28 to become overfull or to "overflow" when the average size of the code word length is large, and code words are applied to the rate buffer for a long period of time at a high rate. The terms "overfull" and "overflow," may not be sufficiently descriptive. The rate buffer is "laden" or loaded by the difference between the variable flow of code words into the buffer and the fixed flow of code words out of the buffer, which forms a "lading" or loading which varies with time. The lading may, from moment to moment, vary from zero (empty buffer) to the maximum capacity of the buffer (corresponding to a full buffer). Any attempt to further increase the lading beyond the maximum capacity, even by one word, creates an "overflow" condition. "Underflow" occurs when the buffer writes or attempts to write to the outside world a number of bits which exceeds the number of bits in the lading, with the result that meaningless zero values are transmitted as meaningful data. When the lading is such that underflow or overflow occurs, some code words may not be stored in the rate buffer 28, or are corrupted, and are therefore lost. The loss of code words is very serious in a predictive encoding type of communication system, and leads to substantial errors (mistracking) in data transmission and consequent distortions of the transmitted picture.

It should be noted that the coarse quantizer (18) in these loops is a nonlinear element, which makes rigorous analysis difficult. Furthermore, the quantizer may have quantizing steps of different sizes as described below, which increases the nonlinearity. However, ignoring the nonlinearity in the analysis produces results which, while not rigorous, indicate trends, and which can therefore be useful.

A known method for stabilizing the lading of the rate buffer (and therefore preventing exceeding the capacity of the buffer by underflow or overflow) is to sense the occupancy or the amount of lading of the rate buffer. A control signal generated in response to the sensed occupancy is applied to at least one of the elements of the predictive coding system which produces the coded difference signal to reduce the rate of generation of the code words when the control signal indicates that the buffer is above or below a certain lading level.

U.S. Pat. No. 4,691,233 and U.S. Pat. No. 4,700,226 issued to A. A. Acampora, describe adaptive control of filters for reducing image resolution, and decimators and interpolators for reducing data rate, both under the control of the fill or occupancy of the rate buffer, for the purpose of prevention of overflow of the rate buffer at the transmitter. U.S. Pat. No. 4,093,962 issued June 6, 1978, to Ishiguro et al., describes adaptive control of the amplitude of the difference signal in response to rate buffer occupancy. U.S. Pat. No. 4,200,866 describes a method employing an adjustable quantizer which is switched between different quantizing characteristics.

When a still image has been transmitted for a substantial time, the difference signals tend towards zero, and the encoding becomes very efficient. This efficiency results in transmission of relatively short codewords at infrequent intervals. If the scene of the image changes drastically and thereafter contains motion, large numbers of relatively large codewords are generated thus, the rate buffer 38 receives, on average at this time, long codewords which represent few pixels. An unobvious problem results. The bits of the codewords must be sent from rate buffer 28 over channel 30 serially. Thus, each long codeword, for example, 20-bits in length, may take as long as 20 modem or channel clock intervals to be transmitted through the channel and loaded into rate buffer 48 at the receiver. The receiver rate buffer 48 must form the serially received long codewords into parallel format, and supply them to its decoder 46 as demanded by decoder 46. The demand is at the pixel clock rate, which is much higher than the channel clock rate. The decoder 46 must decode codewords supplied to it from its buffer 48. The receiver rate buffer 48 may run out of codewords or underflow, and thereby not be able to supply codewords to decoder 46 fast enough to keep up with the demand. Parallel processing cannot shorten this time, because the bits of each codeword are received at receiver 38 and its rate buffer 48 sequentially, and the codeword cannot be supplied by the rate buffer 48 to the decoder 46 until the bits have all arrived. Thus, the long codewords which require a long transmission time (up to 20 channel clock intervals), tend to be read out of the buffer very quickly. Because of their length, the long codewords tend to occupy more buffer space than short codewords. Even if buffer 48 is relatively full of these long codewords, they tend to be read out so quickly that the buffer occupancy falls during the interval in which they are read out. If the rate buffer does not contain a sufficient backlog lading, the reading of the large codewords will deplete its contents to an empty condition, and then either attempt to underflow, causing errors, or be unable to supply the next pixel, which also results in errors. Since the receiver 38 must generate pictures by sequentially producing pixels at the clock rate, the rate buffer 48 must always have a codeword available on demand from the decoder when it is needed to produce the next pixel. If rate buffer 48 is empty at the moment of demand by decoder 46, a codeword may not become available for up to another 20 clock (pixel) intervals, and even when it completes its arrival at buffer 48 and is supplied to decoder 46, it may only satisfy the demand for one pixel or clock interval. Thus, the long codewords which occur during rapid motion of the image represented by the scene being televised may result in receiver 38 being unable to replicate in predictor and delay circuit 44 the signal stored in predictor and delay circuit 24 of the transmitter, because pixels have been corrupted or missed. It is very undesirable to allow the receiver to corrupt or to miss pixels, because in that event the predictors at the transmitter and receiver do not contain the same information, and the image displayed at the receiver will thereafter not correspond to the image being transmitted.

The above-mentioned problem can be solved by keeping a long backlog, for example many frames, stored in the receiver rate buffer 48. However, there is roughly a two-second inherent delay in such a system which is attributable to the passage of the signal through four rate buffers, even for a relatively moderate 10-frame storage in the rate buffers. In a conversational context, this is a very undesirable delay.

There is an additional unobvious problem which can occur even when there is a substantial backlog of information in the receiver rate buffer. This problem is related to the speed with which the receiver decoder 46 can decode long codewords. In principle, the decoder can operate at the pixel clock rate. However, for images with violent motion, the decoder may lag far behind the decoder buffer as discussed above, to the point that the decoder buffer may underflow or be unable to supply difference signals at the pixel rate, which results in erroneous displayed pictures. This problem can also be ameliorated by keeping a large backlog in the decoder buffer, but adds to the conversational delay.

Thus, there is a conflict between the need for short delays and the need to keep the receiver and/or coder buffer from running out of pixels. It is highly desirable to minimize the number of frames stored in each rate buffer in order to minimize the overall system delay. Thus, it is very undesirable to ameliorate the problem of running out of pixels in the rate buffer by increasing the average number of frames stored in the rate buffers.

Copending U.S. Pat. application Ser. No. 928,042 filed Nov. 1, 1986 in the names of N. Fedele and A. Acampora entitled "DPCM System with Rate of Fill Control of Buffer Occupancy", describes a DPCM system in which a control signal is generated which represents at least in part, the rate at which the transmitter rate buffer (e.g. buffer 28 of FIG. 1) is filling, and which controls the processing when the rate of fill exceeds certain thresholds to reduce the number of codewords required to be stored in the rate buffer for transmission over the limited bandwidth channel to the receiver. The processing can be controlled to produce fewer codewords by providing increased temporal decimation or spatial filtering. U.S. Pat. No. 4,023,199 issued May 10, 1977 to Netravali et al. describes a DPCM system in which both fine and coarse quantization laws are used to quantize signals for transmission.

U.S. Pat. 4,583,114 issued Apr. 15, 1986 to Catros describes a DPCM system in which the receiver receives information relating to which of a plurality of quantizers is being used at the transmitter. In order to control the rate of fill of the buffer, it is desirable to initiate the reduction of codewords as soon as possible after it becomes evident that the rate of generating must be reduced. Temporal decimation must be entered into only at frame sync, to prevent initiation of decimation half-way down the raster. It is very desirable to avoid the need to send a codeword to the receiver when the buffer is too full or filling too fast to represent a change in the signal processing because the codeword itself occurs relatively infrequently and would be Huffman coded as a relatively long codeword, and the long codeword occurs just at the wrong time, i.e. when the channel transmission tends to be lagging behind the generating (at the transmitter) and use (at the receiver) of codewords. Furthermore, the use of a plurality of coders and multiplex switches is costly and reduces system reliability. Thus, the above-mentioned Catros system is disadvantageous.

A need is seen, therefore, for a system which will more efficiently process data to the receiver method without adding additional codewords to the transmission. Because DPCM systems use a predictive loop in the receiver which is required to accurately recreate the transmitted information based on adjacent pixel data, it is important that data processing in the transmitter can be faithfully reproduced at the receiver subject to acceptable errors. Thus, systems which attempt to reduce the data in a way which requires transmitted control words to permit the receiver to effectively operate actually increase the data rate and, therefore, are not desirable. Further quantizers whose ensemble of output words changes increases the complexity of the system because the receiver needs to be able to respond to the change in the ensemble of output words. It is, therefore, important that the quantizer output words remain unchanged. This presents a problem in respect of changing the characteristics of a quantizer without changing the output words.

In U.S. Pat. No. 4,093,962, a scheme is described in which the predictive error signal is multiplied by a controllable factor before being quantized into information codes. The factor is determined in response to a buffer status signal for varying the amplitude of the predictive error signal relative to the quantization levels of the quantizer. However, this suffers the disadvantages in that where the ensemble of words of the quantizer changes added complexity to the receiver is required in order to respond to such changes as already discussed.

SUMMARY OF THE INVENTION

According to the present invention, in a DPCM transmitter for processing information signals for transmission through a channel at a given rate to a receiver, a quantizing system comprises subtracting means for subtracting predicted signals from the information signals to generate difference signals having a plurality of values. The quantizing means are responsive to the difference signals applied thereto for generating a set of quantized output signals, each having a discrete, different value, at least one of the output signals corresponding to a plurality of different ranges of values of the difference signals in accordance with an operating mode of the quantizing means. Each operating mode corresponds to a different set of difference signal value ranges. Irrespective of the operating mode, the output signal values produced are only those values in the set of quantized output signals, or in a subset of those quantized output signals.

Buffer memory means are coupled to the quantizing means for receiving quantized signals therefrom for temporarily storing the quantized signals. The buffer means tends to undesirably overfill and underfill. Control means are responsive to the fill state of the buffer means for generating a control signal representing a given fill state and for applying the control signal to the quantizing means to change at least one range of values of the difference signals corresponding to a given rate of fill of the buffer memory means such that the output values have only those values in the set of output values.

DESCRIPTION OF THE DRAWING

FIGS. 4a and 4b, referred to jointly as FIG. 4, are charts listing the actions ordered by fill control circuit 208 under various conditions of fill and rate-of-fill;

FIG. 5 plots trajectories of fill of buffer memory as a function of time in a system according to FIGS. 2, 3 and 4a;

DETAILED DESCRIPTION

Figure 1:
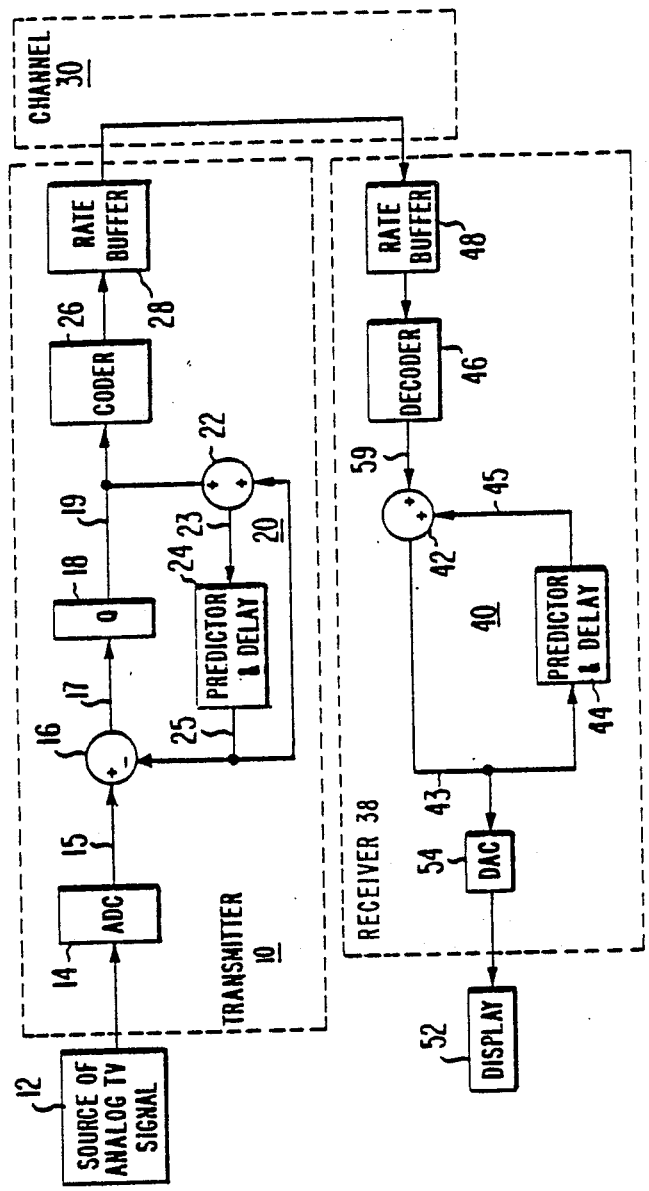
FIG. 1 is a block diagram of a data communication system using a prior art predictive coding system.
Figure 2:
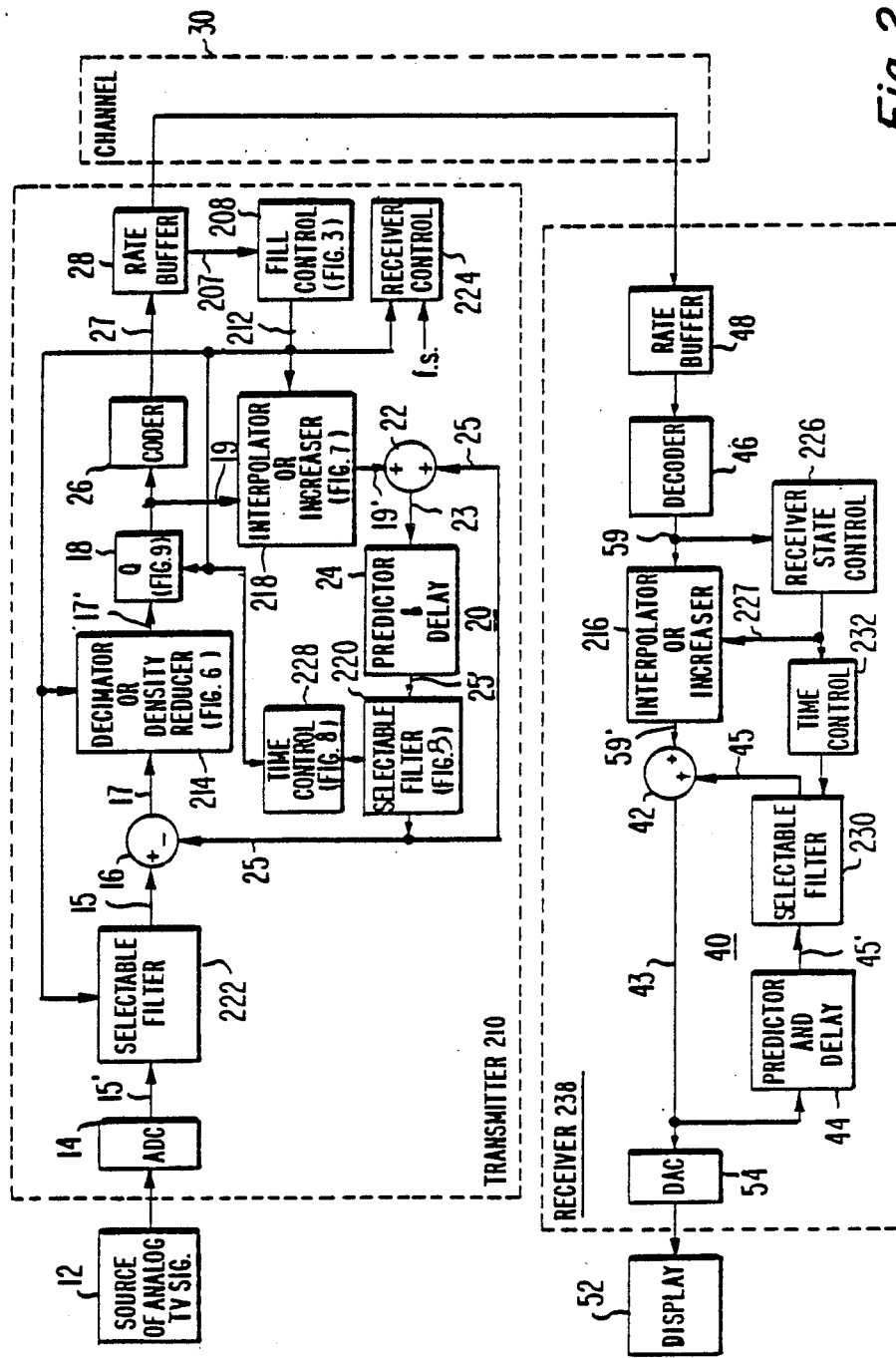
FIG. 2 is a block diagram of a communication system generally similar to that of FIG. 1, further including selectable filters arranged to filter the applied television signals, and decimators and interpolators arranged to operate on the difference signals, and including a fill control circuit coupled to the rate buffer for generating a rate-dependent control signal.

Those elements of FIG. 2 corresponding to elements of FIG. 1 are designated by the same reference numerals. The arrangement of FIG. 2 corresponds to the arrangement described in detail in the aforementioned patent 4,691,233 and in application Ser. No. 928,042 filed Nov. 7, 1986 entitled DPCM System with Rate-of-Fill Control of Buffer Occupancy U.S. Pat. No. 4,706,260. A transmitter 210 communicates via channel 30 with a receiver 238. A fill control circuit 208 in transmitter 210 is coupled to rate buffer 28 for generating on a conductor 212 a control signal which depends at least in part upon the rate of fill of rate buffer 28, as further described below. The control signal on conductor 212 may also be partially dependent upon the absolute amount of fill or occupancy of rate buffer 28. Coarse quantizer 18 is coupled to conductor 212 for having its quantizing characteristics selected under control of the control signal produced by fill control 208.

A decimator 214, sometimes referred to as a data density reducer sample rate converter, receives at its input difference signals from subtractor 16 via conductor 17 and is coupled by conductor 17' to coarse quantizer 18. Decimator 214 is also coupled to conductor 212 for receiving a control signal therefrom. Decimator 214 selectively reduces the data rate under control of the control signal on conductor 212 by decimating pixels, lines or frames. In this context, decimation means deletion of a proportion of the total number of pixels, lines or frames. Decimation of pixels or lines is termed spatial decimation, and decimation of frames is termed temporal decimation. For purposes of explanation, assume that pixels are being decimated. As a more specific example, decimator 214 could eliminate the data word corresponding to every other pixel, which would therefore reduce the true data rate by a factor of 2. This is a drastic reduction in data rate, and other reductions might be preferable, as for example elimination of one out of three (3:2) or 1 out of four (4:3) pixels.

Decimators may be implemented as switches which alternately pass and block the pixels applied thereto, or they may include a sample-and-hold function operated at a clock rate lower than the clock rate of the applied signals. Such a decimator for conversion of ratios of integers is described, for example, in U.S. Pat. No. 4,568,965 issued Feb. 4, 1986, in the name of Powers. Such decimators do not simply delete occasional pixels, but rather produce new sets of pixels with new clock timing, so that signal is always available on each clock cycle. Thus, rather than calling such a sample rate converter a decimator, it might better be termed a data density "reducer" which reduces the sample rate or sample density. However implemented, decimator 214 when it is in a decimation mode reduces the true data rate being applied over conductor 17' to coarse quantizer 18 and coder 26 by an amount established by the control signal on conductor 212.

Since the purpose of the decimating scheme is to reduce the number of difference words applied to rate buffer 28 by reducing the number of words applied to coder 26, coder 26 must have at least its input clock rate adjusted in response to the selected operating mode of decimator 214, if appropriate. Since the output clocking of coder 26 is asynchronous, this clocking need not be changed in response to the operating mode of the decimator.

Decimator 214 when performing spatial decimation (pixel and/or line decimation) has an effect generally similar to that of a filter. When in such a decimation mode, decimator 214 tends to reduce the amount of high frequency data coupled through the system. To the extent that introduction of the decimator does not change the operation or timing of those elements of transmitter 210 which are downstream from the decimator, it also has no effect on receiver 238 other than reducing the high frequency content of the reproduced picture, which tends to blur the reproduced image. Since alternate pixels are being deleted in the aforementioned specific example, receiver 238 must accommodate the reduced data rate as by sample-and-holding each pixel for an additional clock period, or by interpolating each missing pixel from its neighbors in an interpolator, data rate increaser or expander. This interpolation or sample-and-hold function is performed in receiver 238 by an interpolator 216.

A problem arises when the decimator 214 is switched from a nondecimating mode into a decimating mode, as described in the aforementioned patent 4,691,233, in that the data densities or data rates at the inputs of subtractor 16, or at the inputs of adder 22 of transmitter 210 (or 42 of receiver 238) are disparate. This problem is solved in transmitter 210 by an interpolator or data rate increaser 218 coupled between the output of quantizer 18 at conductor 19 and conductor 19' at the input to adder 22. Interpolator 218 is coupled to conductor 212 for receiving control signal therefrom, for being controlled in conjunction with decimator 214, as by being energized simultaneously therewith, but to perform an inverse function. Thus, interpolator 218 produces two nonzero pixels for each pixel having nonzero value applied thereto during those times when decimator or reducer 214 reduces the data by 2:1. In the simple case of 2:1 data reduction by decimator 214, interpolator 218 might pass the undecimated difference pixels, and interpolate between the undecimated difference pixels to produce average or interpolated pixels therebetween, thereby generating an intermixture of alternating unaffected and interpolated pixels for application to adder 22. Alternatively, interpolator 218 might produce four pixels for every three pixels applied thereto when decimator or reducer 214 reduces the number of pixels by the factor 4:3. Such interpolators or increasers are known in the art.

An arrangement similar to the aforementioned Powers arrangement acts as an interpolator when converting from a small sample rate to a higher sample rate. Thus, transmitter 210 of FIG. 2 receives full density data on conductor 15 for application to the noninverting input terminal of subtractor 16. The difference or error signal produced on conductor 17' (and on conductor 19 following quantizer 18) is data density reduced, and the density reduced signal is applied by way of coder 26 and rate buffer 28 to channel 30 and to receiver 238. The density reduced signal on conductor 19 is also applied to interpolator 218 which restores the density and applies the restored density difference signal over conductor 19' to an input terminal of adder 22. Adder 22 also receives full density delayed predicted signals over conductor 25 from the output of predictor and delay circuit 24 (by way of filter 220), and produces full density current predicted signals on conductor 23 for application to predictor and delay circuit 24. The full density delayed predicted signals produced on conductor 25' by predictor and delay circuit 24 are also applied (by way of filter 220) to the inverting input terminal of subtractor 16, where they are subtracted from the applied signal to produce the difference signals. Subtractor 16, adder 22 and predictor and delay circuit 24 of transmitter 210 all operate at a full clock or data rate, which remains constant for all operating conditions. Nevertheless, decimated or reduced density error signals are made available on conductor 19.

Receiver 238 receives reduced density error signals from channel 30. In order to regenerate the signals in receiver 238 in exactly the fashion in which the predicted signals are generated in transmitter 210, interpolator 216 receives the data reduced signals from channel 30 by way of rate buffer 48 and decoder 46 for increasing the density in a manner identical to that by which interpolator 218 increases the density. Thus, the interpolated difference signals on conductor 59' of receiver 238 are identical to those produced on conductor 19' of transmitter 210. The remainder of prediction loop 40 of receiver 238 is identical to prediction loop 20 of transmitter 210, so loop 40 produces predicted signals on conductor 43 which are identical to the predicted signals produced on conductor 23 by transmitter 210. The predicted signals on conductor 43 are made available for display.

Interpolator 216 of receiver 238 must be switched into operation concurrently with the switching of decimator 214 of the transmitter (i.e. at the time at which the decimated frame is issued by decoder 46). In order to reduce the overhead required to be transmitted over the data channel for control of the state of interpolator 216, the control signal which commands the switching is transmitted as needed once each frame interval, depending upon the state of the fill control signal produced by fill control circuit 208. This function is performed by the transmitter 210 receiver control 224, which responds to the fill control signal and to other signals such as frame synchronizing (f.s.) signals to produce command words which are coupled by paths (not illustrated) to coder 26 where they are coded, and from which they pass by rate buffer 28 and channel 30 to receiver 238. At receiver 238, a state control circuit 226 receives the command word or words and controls the status of interpolator 216. Such control functions are well within the skill of those in this art, and further discussion is unnecessary.

The transmitter 210 further includes a selectable filter 222 connected by a conductor 15' between ADC 14 and the noninverting input terminal of subtractor 16. Selectable filter 222 does not act to reduce bandwidth (i.e. is operated in a through mode) during those intervals in which decimator 214 does not perform decimation, in order to provide maximum bandwidth and image resolution. When decimator 214 is placed in a decimating mode, the effective sampling rate o the input signal is reduced. If the input signal includes frequency components near the sample rate, aliasing can occur which results in distortion of the reproduced image. Selectable filter 222 is switched to a filtering mode simultaneously with the switching of decimator 214 into a decimating mode, to filter the input signals to reduce the resolution of the image represented by the signals, and thereby reduce the high frequency components which might interact with the effective sampling rate to produce aliasing. Selectable filter 222 is connected to conductor 212 for receiving fill control signal therefrom. This connection represents control of selectable filter 222 simultaneous with decimator 214 and interpolator 218.

Thus, in a nondecimating mode (if used), decimator 214 does not decimate, interpolator 218 does not increase the density, and selectable filter 222 has maximum bandpass. When fill control circuit 208 produces a control signal on conductor 212 indicating that rate buffer 28 is filling too fast, decimator 214 is set to a particular amount of data density reduction, interpolator 218 is correspondingly set to an exactly inverse data density increase, and selectable filter 222 is switched into a bandwidth limiting mode to reduce aliasing. No filter corresponding to selectable filter 222 is necessary in the receiver. The effect of spatial decimation by decimator 214 and of low-pass filtering by filter 222 is to reduce the resolution or blur the received image displayed at display 52.

When switched into a decimating mode from a nondecimating mode, or from one amount of decimation to a greater amount, a ghost or distorted region is produced which remains fixed in position at the location that a moving edge had at the moment of transition between modes. This ghost results from differences existing a moment after the switching between the resolutions of the images represented by the input signal applied to the inverting input terminal of subtractor 16 and the predicted signal applied to the noninverting input terminal of subtractor 16. This problem is solved by control of selectable filter 220 in transmitter 210 by means of the fill control signal on conductor 212. Selectable filter 220 preferably has filter characteristics identical to those of filter 212. The fill control signal is supplied to selectable filter 220 for control thereof by way of a time control circuit 228.

In operation, selectable filter 220 is switched into a band-limiting mode at the same moment that selectable filter 222 is switched into a band-limiting mode. Filter 220 reduces or eliminates the fixed ghost, but if left in-circuit results in excessive filtration of the image-representative difference signals applied to coder 26 and rate buffer 28 for transmission to receiver 38, which therefore undesirably causes excessive blurring of the reproduced image. In order to reduce the excess filtration, time control 228 causes selectable filter 220 to switch to a mode that does not restrict bandwidth, which switching is done at a predetermined time after filter 220 was switched into a band-limiting mode. A suitable predetermined time is about three (3) frame intervals.

Prediction loop 40 of receiver 238 includes a further selectable filter 230 corresponding to selectable filter 220 of transmitter 210. Selectable filter 230 is identical to selectable filter 220 and is switched into a band-limiting mode at a corresponding time, which as mentioned relates to the same frame and line number. A time control circuit 232 corresponding to time control circuit 228 is coupled to receiver state control 226 for receiving switching signals, and causes filter 230 to switch to a mode not restricting bandwidth, the switching being done at the same predetermined time after an earlier switching into a filtering mode.

Figure 3:
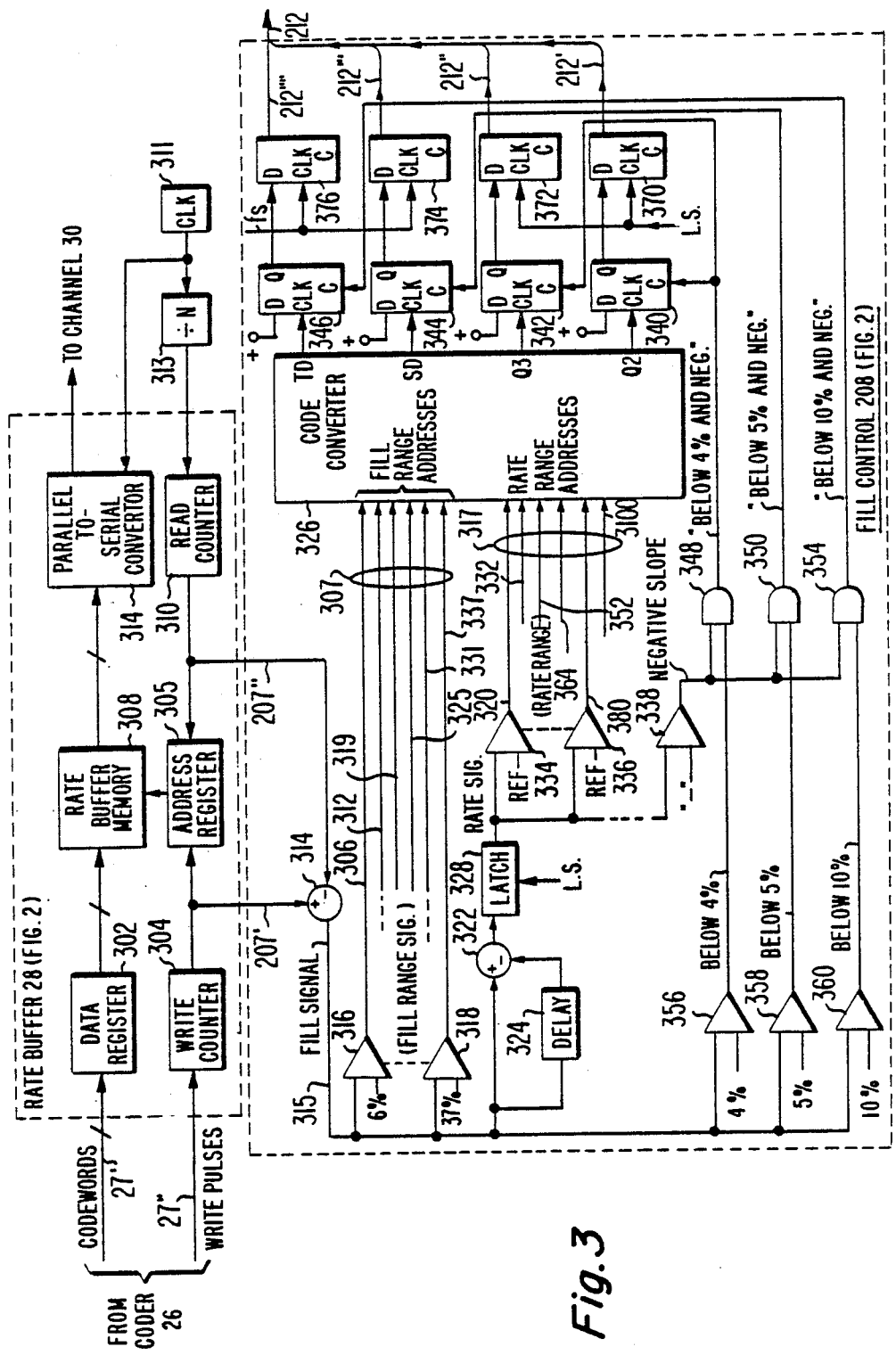
FIG. 3 is a simplified block diagram of fill control circuit 208 of FIG. 2 and its relationship to rate buffer 28.

In FIG. 3, elements corresponding to those of FIG. 2 are designated by the same reference numerals. Codewords are applied at a variable rate over a conductor 27' (part of conductor 27) from coder 26 (not illustrated in FIG. 3) to a data register 302 of rate buffer 28. Concurrently with each bit of the codeword, write pulses are applied over a conductor 27" (part of conductor 27) to a write counter 304 which counts the pulses to produce a cumulative count which is applied to an address register 305 for generating addresses which increase monotonically. The monotonic increase in the count of write counter 304 terminates when write counter 304 overflows, and it begins counting once again from zero count. The overflow of write counter 304 is selected to correspond to the highest address of a rate buffer memory 308. Rate buffer memory 308 is coupled to data register 302 for accepting codewords therefrom, which are written into the location of memory 308 selected by address register 305. Thus, codewords are written into memory 308 beginning at the first address and sequentially thereafter until the last address is reached, after which writing (actually, overwriting) begins again at the first address.

A read counter 310 is coupled by a divide-by-N counter 313 to a source 311 of clock signals which produces clock signals at the rate required for transmission over channel 30. Read counter 310 counts divided clock signals to produce a read count signal which is applied by a conductor 207" to address register 305 to establish read addresses. The read addresses follow the same monotonic pattern of addressing of buffer memory 308, but at a constant rate established by clock 311 rather than at a variable rate established by write pulses from coder 26. The codewords read from buffer memory 308 are applied to a parallel-to-serial converter 314, which converts the words into serial bit form for application to channel 30.

The effective fill of buffer memory 308 is the difference between the location at which codewords are being written into the memory and the location at which stored codewords are being read from the memory, which is the difference between the write and read addresses. The write and read addresses from write counter 304 and read counter 310 are applied over conductors 207' and 207", respectively, to the noninverting and inverting inputs, respectively, of a subtractor 314. Subtractor 314 takes the difference between the write and read addresses and produces a signal on a conductor 315 which represents the level of fill or occupancy of buffer memory 308. In the alternative, a parallel to serial converter may precede the rate buffer memory, wherein the memory is bit-driven rather than sample-driven.

The fill-representative signal on conductor 315 is applied to inputs of six comparators 316 . . . . 318, only the first (316) and the last (318) of which are illustrated. Comparators 316 . . . 318 compare the fill-representative signal on conductor 315 with a plurality of threshold signal values representing 6%, 12%, 19%, 25%, 31% and 37% of the maximum fill of buffer memory 308. For example, comparator 316 compares the fill-representative signal on conductor 315 with a signal representing 10K bytes (each byte having 8 bits), which is about 6% of the 160K byte storage capacity of buffer memory 308. Comparator 316 produces a logic high signal on a conductor 306 when the 6% threshold is exceeded. Similarly, comparator 318 compares the fill representative signal on conductor 315 with a threshold signal representing 60K bytes, which is about 37% of the maximum capacity of memory 308, to produce a logic high signal on conductor 337 when the 37% threshold is exceed. Similarly, logic high levels appear on conductor 312 when 12% capacity is exceeded, and on conductor 319 when 19% is exceeded, etc. The fill range signals appearing on conductors 306, 312, 319, 325, 331 and 337 (referred to jointly as conductor set 307) are applied to a code converter 326 which is actually implemented as a programmable logic array but which is better understood by considering it to be a memory or ROM, the addresses of which include the fill range signals produced on conductor set 307 by comparators 316 . . . 318.

The fill-representative signal on conductor 315 is also applied to the noninverting input terminal of a subtractor 322 and, by way of a delay 324, to the inverting input terminal of subtractor 322. This arrangement produces at the output of subtractor 322 a signal representative of the rate of change of the lading or occupancy of buffer memory 308 over the delay interval of delay 324, and includes a sign bit. When delay 324 is a line delay, the signal produced by subtractor 322 represents the net number of bytes stored in rate buffer memory 308 during the preceding line interval. This signal is applied to a latch 328 which receives line sync (L.S.) signals for latching the rate-representative signal at the end of each horizontal line interval. The latched rate-representative signal is supplied to an array of six comparators 334 . . . 336, only the first (334) and one of the last (336) of which are illustrated. Comparators 334 . . . 336 compare the rate signals with selected reference signals representative of various threshold rates. For example, comparator 334 compares the rate-representative signal from latch 328 with a reference signal representing 20 bytes per line (each byte having, for example, 8 bits), to produce a logic high signal on a conductor 320 of conductor set 317 when the 20 byte per line threshold is exceeded. The signal on conductor 320 is applied as an address to code converter 326. Similarly, comparator 336 compares the rate representative signal applied thereto with a reference signal representative of 80 bytes for producing a logic high level representative of a rate in excess of 80 bytes per line, which is applied over a conductor 380 of conductor set 317 to code converter 326. Other comparators (not illustrated) compare the rate representative signal with thresholds representing 32, 52, 64 and 100 bytes per line to produce on conductors 332, 352, 364 and 3100 of conductor set 317, respectively, logic signals when the thresholds are exceeded. All the rate threshold signals are applied to code converter 326 as additional addresses.

As mentioned, code converter 326 can be considered to be a ROM which is addressed by the logic signals from comparators 316 . . . 318 and 334 . . . 336. In particular, conductors of conductor set 307 are applied to the fill range address input terminals of converter 326, and conductors of conductor set 317 are applied to the rate range address input terminals. It should be noted that the signals on the various input conductors of code converter 326 are not independent. For example, if the input signal on conductor 337 is logic high, this means that the fill is greater than 37%, and therefore it is also greater than 6%, 19% . . . 31%, and therefore all of the input conductors 306, 312, 319, 325 and 331 must also be at a logic high level (i.e. they may not independently be logic low under this condition). Consequently, the ensemble of logic signals available as addresses to converter 326 is much smaller than it would be if the equivalent number of conductors represented independent PCM inputs. Consequently, many of the memory locations of a ROM having the same number of input addresses cannot be addressed, and therefore the ROM is inefficiently used. However, those skilled in the art will readily understand that individualized programmable logic arrays of the type EP600 (manufactured by Alterea, the address of which is 3525 Monroe Street, Santa Clara, CA 95051) can be used instead of a ROM to perform the same function.

Code converter 326 has four output conductors TD, SD, $Q_3$ and $Q_2$. Since there are four output conductors, each memory location must have at least four bits of storage. A logic high level at the Q2 output represents a second quantizing law ($Q_2$) other than the first or basic quantizing law ($Q_1$). A logic high level at the $Q_3$ output represents a third quantizing law ($Q_3$) other than the first basic quantizing law. Thus, it will be understood that at least three quantizing laws are represented by the signals at the $Q_2$ and $Q_3$ outputs of code converter 326. When $Q_2$ and $Q_3$ together output the word 00 (with $Q_3$ being the most significant bit and $Q_2$ the least significant), a basic quantizing law $Q_1$ is to be used by quantizer 18 (FIG. 2). When the $Q_2$, $Q_3$ outputs of code converter 326 together output the word 01, law ($Q_2$) is used. When the $Q_2$ and $Q_3$ output word is 10 (or 11), law $Q_3$ is used rather than either $Q_2$ or $Q_1$. The SD output of converter 326 represents by a logic low level that a basic spatial decimation law ($SD_1$) is to be used, and by a logic high level that a second law ($SD_2$) providing a greater amount of spatial decimation is to be used. Similarly, the TD output of converter 326 represents by a logic low level that a basic temporal decimation law ($TD_1$, which might be a 2:1 decimation) is to be used, and represents by a logic high level that a second temporal decimation law ($TD_2$, such as 4:1) is to be used.

FIG. 4a is a table listing the effect of a particular programming of a ROM-type code converter 326. Rows A-F represent various fill ranges, and columns II-VII represent various rates of fill. The addresses corresponding to the rate range on conductor set 317 appear in lowermost row G. Column I sets out the fill range addresses corresponding to the percentage of fill (for example, a fill range of 6-12% is represented by the address 000 001 on conductor set 307 (FIG. 3). Each intersection of a row A-F and a column II-VII represents by a designation $Q_2$, $Q_3$, SD, or TD, or by lack of a designation, the result required by the programming. An intersection lacking a designation represents use of a basic quantizing law ($Q_1$), a basic spatial decimation ($SD_1$), and a basic temporal decimation law ($TD_1$).

Thus, when rate buffer memory 308 is essentially empty (less than 6% full), as represented by fill range address 000 000 in column I, and the rate of fill is less than 80 bytes/line (columns II to VI), the basic quantizing law $Q_1$, basic spatial decimation $SD_1$, and basic temporal decimation $TD_1$ are selected, as indicated by the lack of designations in row F, columns II-VI. This selection is represented by logic zero levels at the $Q_2$, $Q_3$, SD and TD outputs of converter 326. However, even when buffer memory 308 is in the 0-6% full range, a rate of fill of 80 to 100 bytes/line (as represented by address 011 111 in column VII) causes a memory location to be addressed in code converter 326 which selects second quantizing law $Q_2$, as indicated by the designation $Q_2$ at the intersection of row F and column VI. This selection is represented by a logic high level on the $Q_2$ output of code converter 326 (FIG. 3), and logic zeroes at the $Q_3$, SD and TD outputs. In the highest fill range of 31 to 37%, represented by address word 011 111 as indicated in row A, Column I, the basic quantizing law ($Q_1$) is not used for any rate of fill. Even at relatively low rates of fill such as 0 to 20 bytes/line, quantizing law $Q_2$ is required, as indicated by the designation $Q_2$ at row A, column II; thus at least the second quantizing law is used to tend to reduce the rate of fill when the fill exceeds 31%.

At the highest fill range (31-37%) and highest rate of fill (80-100 bytes/line) the third and most coarse quantizing law ($Q_3$) is used (as represented by the designation $Q_3$ at row A, column VII, together with increased spatial decimation ($SD_2$) and increased temporal decimation ($TD_2$). The combination of all three maximum data reduction programs is expected not only to prevent the net buffer memory fill from increasing under worst-case motion conditions, but to actually reduce the lading of buffer memory 308 under worst-case conditions of image motion. Under these worst-case conditions, the transmitted image or picture will be degraded by comparison with the image transmitted under more still conditions, but the degradation is subjectively less noticeable during violent motion. For buffer memory occupancies in fill regions less than 31% and rates of fill less than 80 bytes/line, the selected data reductions are indicated by the designations in the appropriate intersections in the table of FIG. 4a.

The quantizing law is changed "first", i.e. changed from $Q_1$ to $Q_2$ before the spatial and/or temporal decimation are changed away from $SD_1$ and $TD_1$, because of a subjective estimation that the "puddling" or "contouring" caused by a more coarse quantizing is less objectionable than the loss of resolution or blurriness caused by increased spatial decimation or the perceptible jerkiness of motion caused by increased temporal decimation. As between spatial and temporal decimation, a subjective judgement indicates that the effects of increased spatial decimation are less objectionable than the effects of increased temporal decimation. Other judgements can be made, resulting in different operating patterns than that illustrated in FIG. 4a.

The $Q_2$, $Q_3$, SD and TD output terminals of code converter 326 are coupled to the clock (CLK) inputs of an array of D-type flip-flops (FF) 340, 342, 344 and 346, respectively. The D inputs of FF 340-346 are coupled to a positive (+) voltage source, with the result that at the instant any one of the $Q_2$, $Q_3$, SD or TD outputs of code converter 326 goes high, its corresponding FF 340, 342, 344 or 346, respectively, produces a logic high at its Q output. Thereafter, the clock input of the FF cannot affect the Q output, so FF 340-346 act as latches, latching the logic high level applied to their D inputs. The latched outputs could be used directly for controlling the coarse quantizer, spatial or temporal decimators. However, the signals are delayed or retimed to the next following frame synchronizing (sync) signals in the case of the SD and TD signals, and the next following line sync in the case of the $Q_2$ and $Q_3$ outputs. This is accomplished by applying the Q output of each of FF 340–346 to the D input of a further D-type FF, the clock input of which is coupled to receive the appropriate sync pulse. In particular, the Q output of FF 340 is coupled to the D input of a FF 370, and the Q output of FF 342 is coupled to the D input of a FF 372. Both FF 370 and 372 receive line sync (L.S.) at their clock (CLK) inputs for retiming the $Q_2$ and $Q_3$ signals and for coupling the retimed $Q_2$ and $Q_3$ signals to conductors 212′ and 212″, respectively, which are part of conductor 212. Similarly, the Q output of FF 344 is coupled to the D input of a FF 374, and the Q output of FF 346 is coupled to the D input of a FF 376. Both FF 374 and 376 receive frame sync (f.s.) at their clock inputs for retiming the SD and TD signals to frame sync, and for coupling the retimed SD and TD signals to conductors 212‴ and 212⁗, respectively, which are also part of conductor 212 of FIG. 2.

In operation, when either a high rate of fill occurs at a low occupancy of buffer memory 308, or a moderate rate of fill occurs at high buffer memory occupancy, and for high occupancy and rate of fill, various data rate reduction mechanisms are implemented, which are calculated to ultimately reduce the buffer occupancy by reducing the rate of fill to below the rate at which buffer memory 308 empties. The rate at which buffer memory 308 empties is established by the read rate, which, in turn, is pre-established by the data rate of the channel. Thus, once the data reduction is implemented, and depending upon the moment-to-moment characteristics of the image to be transmitted, buffer memory 308 will ultimately experience a decreasing occupancy.

The decreasing occupancy represents a negative slope of the rate signal at the output of subtractor 322 and latch 328 of FIG. 3. A comparator 338 compares the rate signal with a reference signal representing a negative slope, and produces an output signal representing negative slope (or if the sign bit is separate at the output of latch 328, comparator 338 is not required). The signal representative of negative slope is applied to an input terminal of each of AND gates 348, 350 and 354. The fill-representative signal on conductor 315 is applied to inputs of a set of comparators 356, 358 and 360, which compare the fill signal with reference signals representing 4% fill, 5% fill and 10% fill, respectively, to produce fill range signals which represent occupancies below the reference percentages which are applied to inputs of AND gates 348, 350 and 354, respectively. AND gate 354 is enabled by concurrence of occupancy below 10% and a negative slope (buffer emptying) signal to produce a clear signal which is applied to the clear (C) input terminal of FF 346 for clearing FF 346, thereby setting its Q output to logic zero. The logic zero level is not applied to conductor 212⁗, however, until the next following frame sync interval, because of the retiming effect of FF 376. The retimed logic zero level is coupled by FF 376 to conductor 212⁗ for returning the temporal decimation to its basic TD1 law. AND gate 350 is enabled by concurrence of occupancy below 5% and decreasing occupancy of buffer memory 308 to produce a clear signal which is applied to the C input terminal of FF 344 for clearing FF 344 and for setting its Q output to logic zero. The logic zero level is retimed to frame sync by FF 374, and is coupled to conductor 212‴ for returning the spatial decimation to its basic SD1 condition.

AND gate 348 is enabled by concurrence of occupancy below 4% and decreasing occupancy of buffer memory 308 to produce a clear signal which is applied to the C input terminals of FF 340 and 342 for resetting their Q outputs to logic zero. The resulting logic zero signals are retimed by line sync to place conductors 212′ and 212″ in a logic zero condition for selecting the basic $Q_1$ coarse quantizing law. As described below, the quantizing law change is selected in such a manner that even though changes are allowed at the transmitter at the line rate (or even more often, if desired), additional overhead is not needed for control of the receiver.

Figure 5:
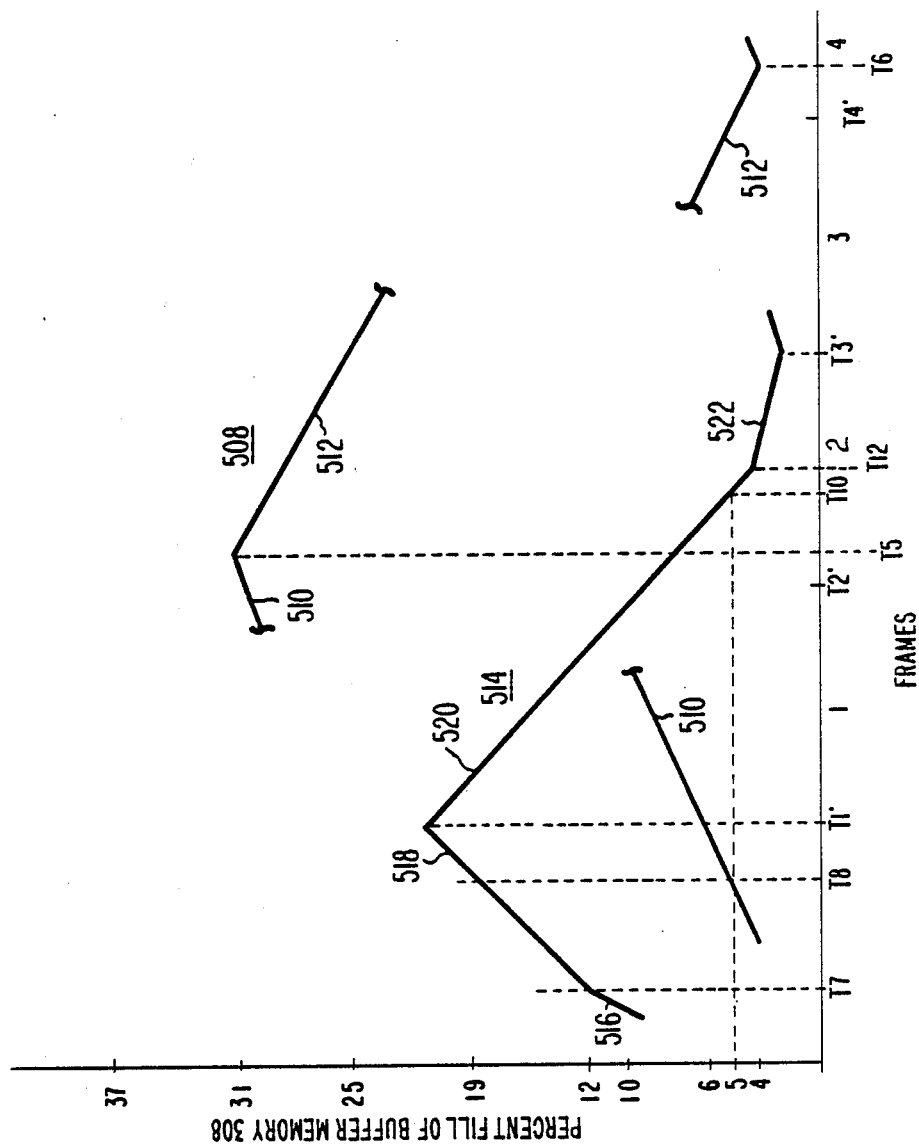

FIG. 5 illustrates several possible trajectories which the occupancy of buffer memory 308 might take as a result of normal operation of the system of FIG. 2 coupled with the fill control of FIG. 3 and the table of FIG. 4a. In FIG. 5, the ordinate represents occupancy of buffer memory 308 in percent, and the abscissa represents time, with frames designated by the numerals 1, 2, 3, and 4, and the intervening frame sync times indicated as T1′, T2′, T3′ and T4′. The trajectories illustrated in FIG. 5 are averages, and the actual trajectories may be very erratic or noisy, and depend upon the characteristics of the image being processed. A first trajectory designated generally as 508 has a portion 510 which has a relatively low fill rate of less than 20 bytes/line, at occupancies below 10% in the vicinity of time T1′. Referring to column II, line F of FIG. 4a, no action is required, and the system remains in the basic $Q_1$, $SD_1$ and $TD_1$ modes. In fact, column II shows that the fill can increase to 31% at a rate of rise of less than 20 bytes/line without action being taken.

In FIG. 5, trajectory 510 reaches 31% occupancy at a time T5, still with a low rate of rise. From column 11, line A of FIG. 4a, reaching this transition value causes the second coarse quantizing law ($Q_2$) to be applied. The $Q_2$ law is applied at the next line sync, which is essentially immediately (time T5) to the time scale of FIG. 5. For the conditions illustrated, this results in a trajectory 512 having a slow decrease in occupancy. This decrease continues until a time T6 at which time the occupancy reaches 4%, and the basic quantizing law $Q_1$ is again applied. This takes place over a period of several frames, possibly more frames than the number illustrated. For example, if the rate of fill is 20 bytes/line, each frame has 260 lines, and the buffer memory can hold 160K bytes, it takes more than 9 frame intervals to go from an empty buffer condition to a 31% occupancy condition.

A second trajectory 514 illustrated in FIG. 5 includes a portion 516 rising at 50 bytes/line until it reaches 12% occupancy at time T7, whereupon at the next following line interval quantizing law $Q_2$ is imposed, pursuant to column IV, line D of FIG. 4a. The rate of increase continues at 35 bytes/line (portion 518 of trajectory 514) until it reaches 19% occupancy at time T8, at which time, referring to column IV, line D of FIG. 4a, quantizing law $Q_2$ continues to be imposed, and spatial decimation law SD2 is scheduled to be imposed at the time (T1′) of the next following frame sync interval. The rate of rise continues at 35 bytes/line until time T1′, at which time spatial decimation-on law $SD_2$ is imposed, which reduces the rate at which rate buffer memory 308 fills so that the net occupancy falls, as illustrated by line portion 520. The decrease of occupancy continues until 5% fill is reached at time T10, which schedules a change of $SD_2$ back to $SD_1$, but no change is made in the spatial decimation until the next following frame sync interval. At time T12, trajectory portion 520 reaches 4% occupancy, and at the next following line interval (essentially immediately in the time scale of FIG. 5) the quantizing law is changed from $Q_2$ to the basic $Q_1$ law. The $SD_2$ spatial decimation continues, causing the occupancy to continue to decrease along trajectory portion 522 until frame sync occurs at time T3', when the basic spatial decimation law $SD_1$ is again imposed. Occupancy thereafter may remain constant, increase or decrease, depending upon the image characteristics then prevailing.

FIG. 4b is a table similar to FIG. 4a, which has been found to be satisfactory for a system including two quantizing laws (one basic law and one other law), two temporal decimation laws, and only basic spatial decimation which does not change.

Figure 6:
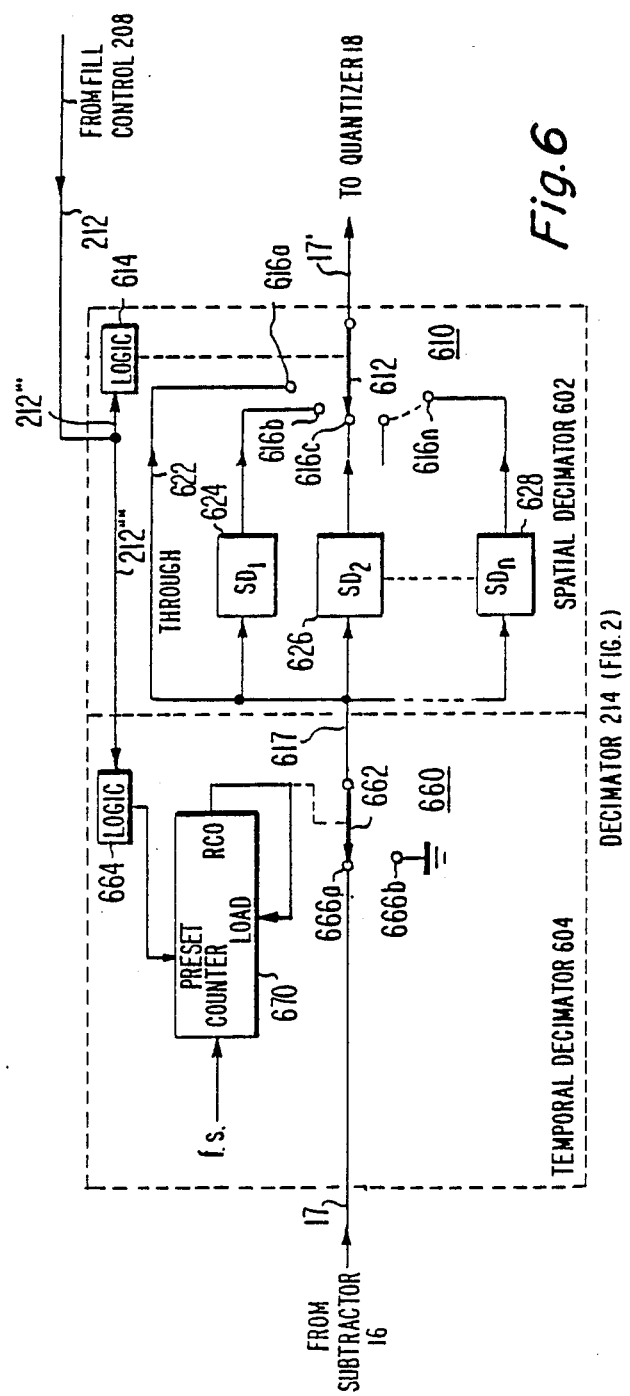
FIG. 6 is a simplified block diagram of a decimator (data density reducer) useful in the arrangement of FIG. 2.

In FIG. 6, decimator 214, illustrated in FIGURE 2, performs both temporal and spatial decimation. As illustrated and hereinafter described, decimator 214 is slightly more complex than is necessary to fulfill its function in the arrangement of FIGS. 2 and 3, in order to illustrate the general principles of operation. Those skilled in the art will readily understand that only two of the multiple spatial decimation functions are required to implement the embodiment described in conjunction with FIGS. 2, 3 and 4a, but that the more general aspects of the arrangement of FIG. 6 may be used for more complex embodiments. In FIG. 6, the spatial decimation portion 602 of decimator 214 includes a multiplex switch 610 which is actually implemented in the form of an array of independent solid-state gates but which is illustrated as a mechanical switch. Hereinafter, all multiplex switches are illustrated as mechanical equivalents, whatever their actual form.

Multiplex switch 610 includes a controllable wiper 612, the position of which is controlled by control signals applied from fill control circuit 208 (FIG. 2) over conductor 212, by the use of a logic circuit 614 if control is to be performed by a plurality of bits. Wiper 612 can be set by logic circuit 614 to couple any one of a plurality of terminals 616a, 616b, 616c ... 616n to output conductor 17' which is adapted to be coupled to quantizer 18 (FIG. 2). Input conductor 17 is adapted to receive difference signals from subtractor 16 (FIG. 2). The difference signals are coupled from conductor 17 through a multiplex switch 660 of the temporal decimation portion 604 of decimator 214 to conductor 617, which is the input conductor for the spatial decimation portion of decimator 214. Conductor 617 is coupled to each of terminals 616 by a separate path. The path between conductor 617 and switch terminal 616a is by way of a through path designated 622, which is a nondecimating path which might be used for the basic decimating law. A second path extends between conductor 617 and switch terminal 616b by a way of first fixed decimator 624, which is designated $SD_1$ to represent one value of decimation. Decimation law $SD_1$ might be selected to be the basic decimation used for the basic spatial decimation rather than through path 622. A path between input conductor 617 and switch terminal 616c is by way of a second fixed spatial decimator 626, labeled $SD_2$ to indicate that it has a different decimation or sample rate conversion than decimator 624. In a similar manner various other paths between conductor 617 and switch terminals 616 may be provided, including a further fixed spatial decimator 628 denominated $SD_n$ which is connected to switch terminal $616_n$.

In operation, logic circuit 614 receives fill control signals over conductor 212" of conductor set 212. If the fill control signals are simply two-level binary bits, they may be applied directly for control of wiper 612, otherwise logic circuit 614 performs one-of-N conversion or decoding in order to control the position of wiper 612, which selects the appropriate through path or spatial decimator for the fill control condition indicated by the fill control signal. To be specific, the arrangement of FIGS. 2 and 3 requires only the $SD_1$ and $SD_2$ spatial filters of FIG. 6 to perform the spatial filtering functions described in conjunction with either of FIGS. 4a or 4b, so only blocks 624 and 626 are needed for connection between conductor 617 and terminals 616 of multiplex switch 610, and the bilevel signal on conductor 212''' can control the condition of wiper 612 directly, obviating the need for logic circuit 614.

The temporal decimation aspect of decimator 214 of FIG. 6 is performed simply by forcing the difference signal (the signal on conductor 617) to equal zero during the frame being decimated. This has the effect of causing predictor loop 20 (FIG. 2) to recirculate the previous frame, and also sharply reduces the data rate, by generating a complete frame of maximum-length zero runs. Rather than reducing the data rate by generating a long string of maximum-length zero runs, the frame of all-zero differences may be further data reduced by coding as a single codeword which when received by receiver state control 226 (FIG. 2) results in issuance of an entire frame of zeroes from interpolator 216 to adder 42 of prediction loop 40, whereupon the previous frame is recirculated by prediction loop 40 and displayed by display 52. The temporal decimation portion of decimator 214 as illustrated in FIG. 6 includes multiplex switch 660, wiper 662 of which may be controlled to the position illustrated (in contact with terminal 666a) for passing difference signals from conductor 17 to conductor 617, and which may also be controlled to an alternate position (in contact with grounded terminal 666b) for coupling a logic zero to conductor 617. Wiper 662 is controlled by the ripple carry output (RCO) of a synchronous four-bit (preset) counter 670, which is synchronously preset upon the application of a logic low level to the load input terminal. The RCO output of counter 670 remains in a logic high condition until it reaches the preset count whereupon it drops to a logic zero level. The RCO output terminal of counter 670 is coupled to the LOAD input terminal. Counter 670 is preset to a predetermined count by a logic circuit 664 in response to the signal received from conductor 212'''', and which counts down towards zero count in response to a frame sync (f.s.) input. Thus, if the basic temporal decimation $TD_1$ is 2:1, and $TD_2$ is 4:1 decimation, preset counter 670 operates in the following manner.

When fill control 208 (FIG. 2) requires temporal decimation characteristic $TD_1$, logic 664 will provide a binary code of 1 to the preset inputs of counter 670. When the RCO output is low, this binary code will preset counter 670 to a count of 1 at the next f.s. clock pulse, and the RCO output will go to a logic high condition. On the following f.s. clock pulse, counter 670 will count down to zero and the RCO output will go to a logic low condition, thereby initiating repetition of the cycle. Thus, the condition of the RCO output of counter 670 will alternate between logic low and logic high on successive frames. If a logic low level of RCO closes wiper 662 to ground in contact with terminal 666b, then a temporal decimation of 2:1 will be achieved. On the other hand, when fill control 208 indicates that temporal decimation $TD_2$ is required, then logic circuit 664 will present a binary code of 3 to the preset inputs of counter 670. When RCO becomes logic low, the new binary code will preset counter 670 to a count of 3 on the next f.s. clock pulse. Successive frame sync clock pulses will cause counter 670 to count down from 3 to 2 to 1 to zero, such that RCO will be logic low for only one frame out of four, and logic high for 3 frames out of 4. Therefore, the logic high level at RCO will cause wiper 662 to be connected to ground (666b) for three frames out of four, thereby effecting a 4:1 temporal decimation. A counter 670 is implemented by a 74 Series 163 Counter (binary, synchronization with clear), manufactured by Texas Instruments Corp.

Figure 7:
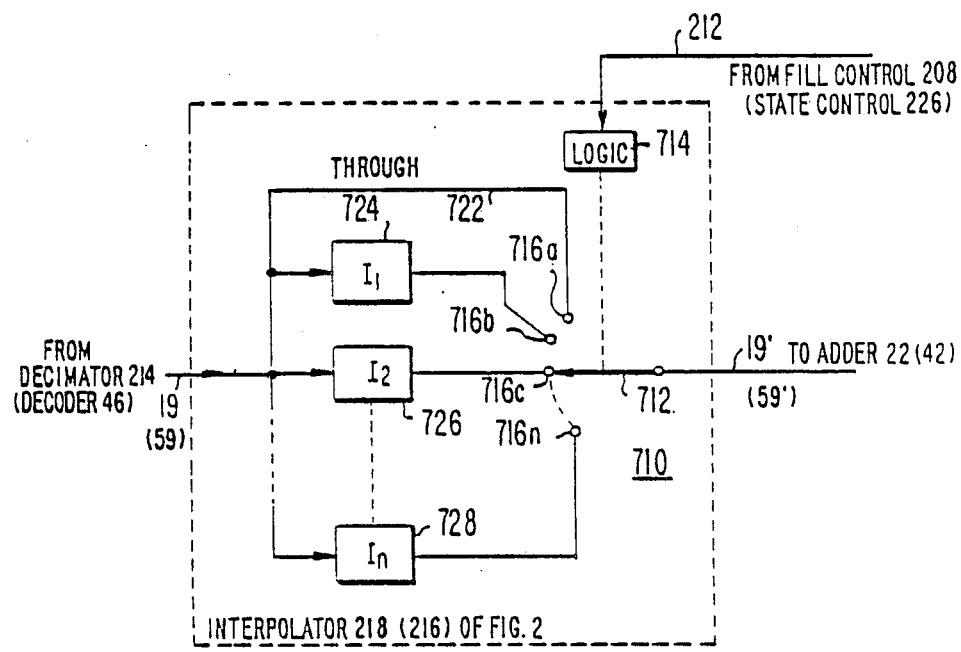
FIG. 7 is a simplified block diagram of an interpolator (data density increaser) useful in the arrangement of FIG. 2.

FIG. 7 is a simplified block diagram of interpolator 218 (or 216) of FIG. 2. As with decimator 214, interpolator 218 as illustrated in FIG. 7 is slightly more complex in some aspects than necessary for use with the arrangement of FIGS. 2 and 3 functioning according to FIG. 4a or 4b, in order to illustrate general principles. The structure of interpolator 218 is generally similar to the structure of the temporal decimator portion of decimator 214. Interpolator 218 is controlled by a logic circuit 714 which is coupled to receive fill control signals over conductor 212 (or conductor 227 in the case of interpolator 216). Logic circuit 714 performs one-of-N conversion or decoding conductor 212, if necessary, and sets wiper 712 in contact with one of switch terminals 716a, 716b, 716c . . . 716n. Input conductor 19 is common to a number of paths, each of which terminates at a switch terminal 716. A first path is a through path designated 722 which terminates at switch terminal 716a. Such a through path may be selected in conjunction with the through path 622 of decimator 214 of FIG. 6. A first fixed interpolator 724 is designated $I_1$ and is coupled between common input conductor 19 and switch terminal 716b. Similarly, a further plurality of interpolators having different interpolation functions designated 726 . . . 728 is coupled between conductor 19 and switch terminals 716c . . . 716n, as required for operation of the system. Each of interpolators 726 . . . 728 has an interpolation function $I_1 \ldots I_n$ which is the inverse of decimation function $D_1 \ldots D_n$ of decimators 624–628. Logic circuits 714 and 614 are similarly structured so as to select corresponding decimation and interpolation functions for the same control signal conditions, or for corresponding signal from receiver state control 226, in the case of interpolator 216.

Figure 8:
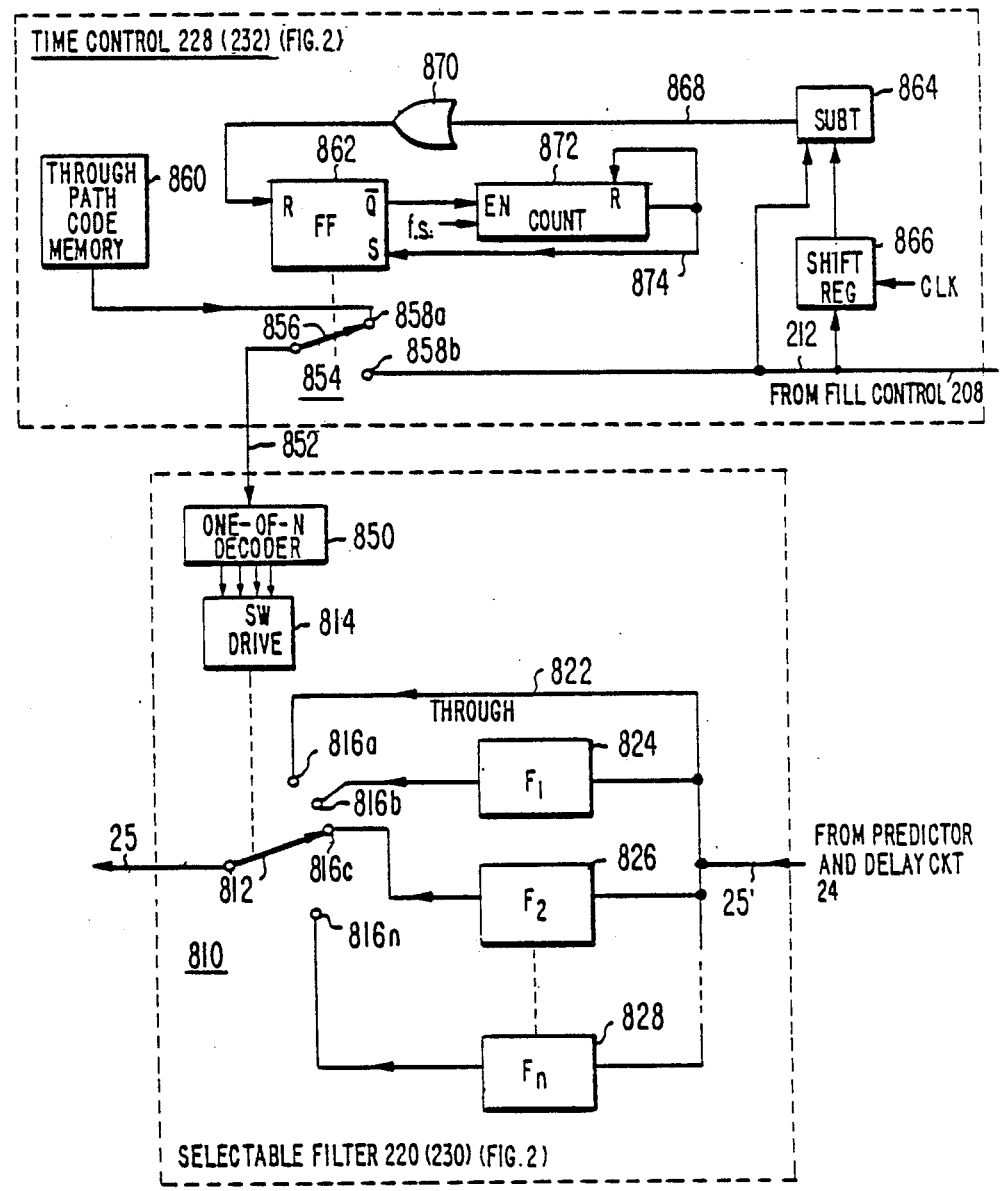
FIG. 8 is a simplified block diagram of a selectable filter and a timing apparatus useful in the arrangement of FIG. 2.

FIG. 8 is a simplified block diagram of selectable filter 220 of FIG. 2, together with time control 228. These are identical to filter 230 and time control 232, respectively, of FIG. 2. In FIG. 8, selectable filter 220 includes a multiplex switch designated generally as 810 with a movable wiper 812 controllable by a switch drive circuit 814 which connects movable wiper 812 between conductor 25 and one of a plurality of terminals 816a, 816b, 816c . . . 816n, the number of which is selected in accordance with a number of functions required. Selectable filter 220 continuously receives delayed predicted signal on common conductor 25', which is connected to each of terminals 816a . . . 816n by a separate path. A through path between conductor 25' and terminal 816a is designated 822. A first fixed low-pass filter 824 having filter function F is connected between common conductor 25' and a second switch terminal 816b. Similarly, a plurality of further fixed filters 826 . . . 828 with filter functions $F_2 \ldots F_n$ is connected between conductor 25' and terminals $816_c \ldots 816_n$. Each of filter characteristics $F_1 \ldots F_n$ is selected in conjunction with the corresponding filtering characteristic of selectable filter 222 (FIG. 2) so as to substantially eliminate ghosting. A one-of-N decoder 850 is used, if necessary, to decode the control signal applied thereto over a conductor 852 from a multiplex switch 854, which is part of time control 228. Multiplex switch 854 includes a wiper 856 coupled to conductor 852, and also includes terminals 858a and 858b connected to a through path code memory 860 and to conductor 212, respectively. Terminal 858b receives fill control signal over conductor 212 from fill control unit 208.

The position of wiper 856 of multiplex switch 854 is controlled by a flip-flop (FF) 862. FF 862 is normally in a set condition, which holds movable wiper 856 in contact with terminal 858a, for coupling a through path code from a memory 860 to one-of-N decoder 850. If conductor 212 carries only a single bit for controlling the function of selectable filter 220, through path code memory 860 may be simply a grounding connection for terminal 858a, which therefore applies a logic zero to one-of-N decoder 850 for representing the basic filter function, which as mentioned is nominally infinite bandwidth represented by through path 822. If selectable filter 220 has more than two states or filter functions, one-of-N decoder 850 is used and responds to the through path code to set wiper 812 of multiplex switch 810 in contact with conductor 816a, thereby setting selectable filter 970 into the through path condition. Thus, the normal condition of selectable filter 970 is the through condition providing nominally infinite bandwidth.

Subtractor 864 has a first input terminal coupled to conductor 212 for receiving fill control signal. Shift register 866 is coupled between conductor 212 and a second input terminal of subtractor 864. Shift register 866 delays the control signal applied to the second input terminal of subtractor 864 for one clock cycle. So long as the control signal on conductor 212 remains unchanged from cock cycle to clock cycle, the same signal is applied to both input terminals of subtractor 864, and subtractor 864 produces logic zero signal on its output conductor 868. The clock cycle may be pixel to pixel, scan line to scan line or frame to frame depending upon the design criteria. Any time a change occurs in the control signal on conductor 212, different signals are momentarily applied to the inputs of subtractor 864, which responds by producing a nonzero value on conductor 868 for application by OR gate 870 to the reset (R) input terminal of FF 862. FF 862 responds with a transition which (a) throws wiper 856 of switch 854 into contact with terminal 858b, and (b) generates a signal at its $\overline{Q}$ output which is applied to the enable (EN) input terminal of a counter 872, which also receives frame sync (f.s.) signal at an input, whereby counter 872 begins counting frame synchronization signals. Until such time as counter 872 reaches full count, fill control signals are applied from conductor 212 by way of terminal 858b and wiper 856 to one-of-N decoder 850, which responds by switching wiper 812 of switch 810 into contact with the appropriate one of terminals 816b . . . 816n, for selecting one of filter characteristics $F_1 \ldots F_n$. When counter 872 reaches the desired count, as for example the aforementioned count of three frame intervals, it produces an output signal on a conductor 874 which resets counter 872, and which is also applied to the set (S) input terminal of FF 862 to return it to the set condition. When FF 862 returns to the set condition, wiper 856 returns to contact terminal 858a, once again coupling through path code to decoder 850, which operates wiper 812 to contact terminal 816a for selecting the through path. Thus, a transition in the control signal on conductor 212 resets FF 862, allowing the control signal to be applied to one-of-N decoder 850, which sets wiper 812 to the appropriate filtering condition. After the desired number of frame intervals expire, FF 862 is set, returning multiplex switch 854 to a state in which it passes the output form through code memory 860 to decoder 850, which responds by setting multiplex switch 810 to the through position. Naturally, selectable filter 222 of FIG. 2 may be configured much like that portion of FIG. 8 attributable to selectable filter 220.

The ranges and fill levels at which actions take place are based in part upon subjective judgements of quality, and also depend in part upon the scenes to be transmitted, so quantitative analysis is difficult. Thus, the cutoff points for action may be selected differently than those described, but in general the described undesired effect at the receiver of inability of the decoder to supply difference words to the adder fast enough may be expected to reduce.

Figure 9:
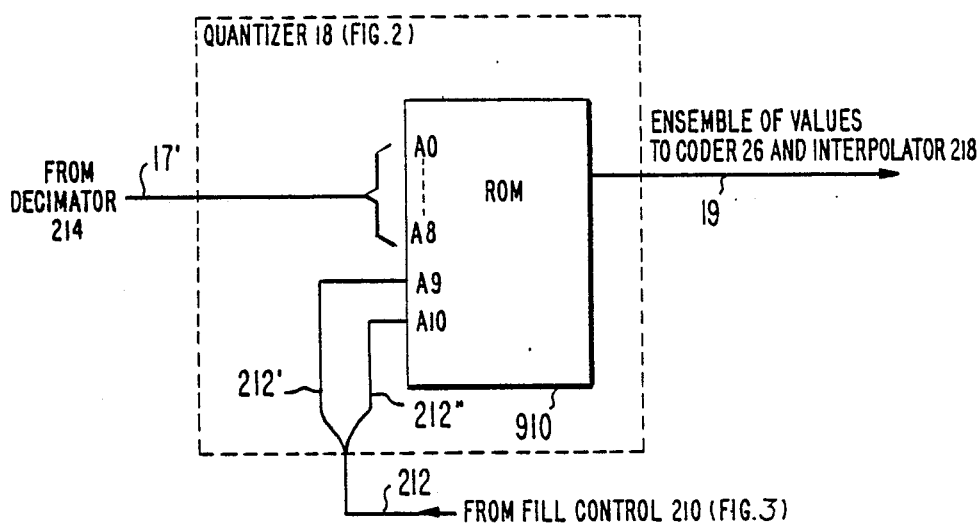
FIG. 9 is a simplified block diagram of a coarse quantizer including a ROM, which may be used with the arrangements of FIGS. 2 and 3.

FIG. 9 is a block diagram of an adaptive coarse quantizer 18 which may be used in conjunction with the arrangement of FIG. 2 and FIG. 3. The quantizer of FIG. 9 having characteristics as described in conjunction with FIG. 10 is particularly advantageous because the ensemble of output words remains unchanged even though the coarse quantizing function changes to aid in adjusting the data rate. Therefore, the ensemble of words to which coder 26 (FIG. 2) must respond does not require adjustment. Also, control words need not be sent from transmitter 210 to receiver 238 (FIG. 2), which would undesirably tend to increase the data rate.

Quantizer 18 in the present embodiment is controllable to alter the coring region, i.e., to increase the zero run length in cases where the rate buffer is filling too quickly or the buffer is overladen. However, other input values of the quantizer may be adjusted depending upon a given implementation. By increasing the zero run length, the string of zeros can be represented by a much shorter word, therefore increasing transmission efficiency. While it is recognized that such changes in the coring of the data produces distortion, such distortion is acceptable as compared to the loss of data, which is unacceptable. The important aspect of quantizer 18 is that the changes to the coring region, i.e., the zero quantization, is transparent to the receiver and thus requires no additional hardware at the receiver. Further, no additional codewords need to be transmitted to the receiver because the receiver reconstructs the varying zero run length normally. Quantizer 18 alleviates the extreme condition of buffer over or underfill at the expense of temporarily decreasing picture quality where it is acceptable in these circumstances. Further, such distortion is temporary during the occurrence of any combination of unacceptable fill conditions of the rate buffer.

In FIG. 9, elements corresponding to those of FIG. 2 are designated by the same reference numeral. Coarse adaptive quantizer 18 includes a read only memory (ROM) 910 having nine input addresses $A_0 \ldots A_8$, and also having page control input addresses $A_9$ and $A_{10}$. While one ROM is shown, in other implementations a plurality of ROMS may be used, each containing one or more pages of quantization laws. The difference word is applied over conductor 17' to addresses $A_0$–$A_8$ of ROM 910, and conductors 212' and 212'' of conductor set 212 are applied to input terminals $A_9$ and $A_{10}$ respectively. Each address and page number input accesses a memory location in ROM 910 which produces a word on output conductor 19 for application to coder 26, FIG. 2. The digital word stored at each address of ROM 910 includes a magnitude or value, a bin number, or both, as described above. As described in conjunction with FIG. 3, the fill control signals on conductors 212' and 212'' may have a magnitude of logic zero or logic one, depending upon the coarse quantization law which is desired.

Figure 10A:
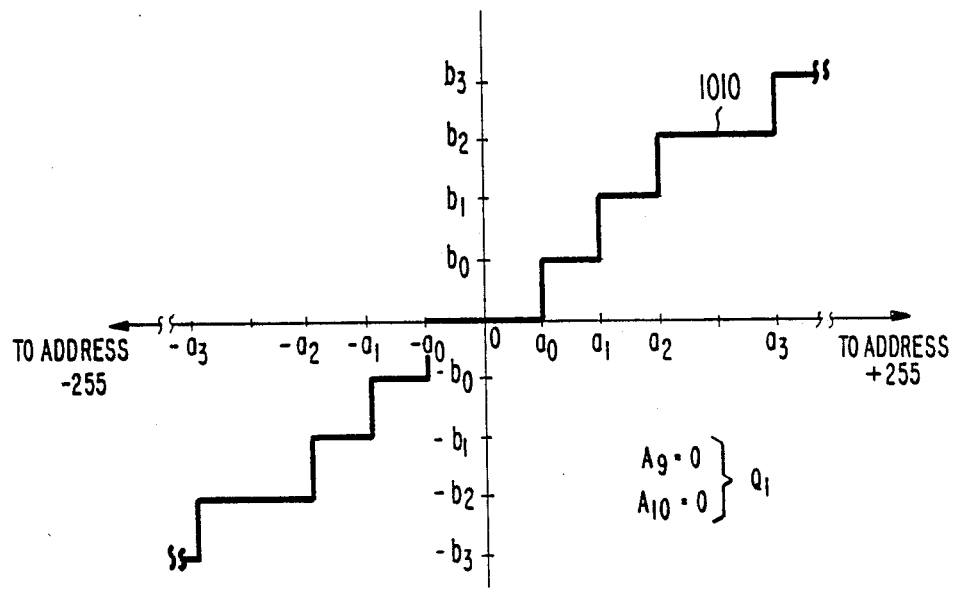
FIG. 10a, 10b and 10c referred to jointly as FIG. 10, represent input-output characteristics of various pages programmed into the ROM of FIG. 9.

FIG. 10a illustrates the coarse quantization law provided by the arrangement of FIG. 9 for logic zero inputs from conductors 212' and 212'' to addresses $A_9$ and $A_{10}$ (i.e. for a page selection word of 00). The abscissa of FIG. 10a represents a linear scale related to the value of the digital word applied over conductors 17' to input addresses $A_0 \ldots A_8$. To be more specific, points along the abscissa designated $a_0$, $-a_0$ represent word values of $\pm 5$, points $a_1$, $-a_1$ represent $\pm 10$, points $a_2$, $-a_2$ represent $\pm 15$, and $a_3$, $-a_3$ represent $\pm 25$. Many other values are possible up to $\pm 255$ within the luminance range of the picture being transmitted. The ordinate of the graph, FIG. 10a, represents the quantization levels or value of the output signal produced by ROM 910, FIG. 9, on conductor 19. The output quantized signal values illustrated are $b_0 \ldots b_3$ and corresponding negative values.

The quantizer 18 has a characteristic 1010 which has an output value of zero for inputs ranging from $-a_0$ to $a_0$, so that all values of difference signals arriving over conductor 17' which lie in this range are cored (produce zero output signal). All signal input values extending from $a_0$ to $a_1$ produce the single output value $b_0$, and similarly input signals ranging from $-a_0$ to $-a_1$ produce a single output signal value $-b_1$. Input signals lying within the range of $a_1$ to $a_2$ produce $b_1$ as an output signal, and corresponding negative values produce $-b_1$ as the output value. As so far described, output signals zero, $b_0$ and $b_1$ are each generated by a "bin" of positive input values in the ranges of zero to $a_0$, $a_0$ to $a_1$ and $a_1$ to $a_2$, each bin containing five input signal values (0–5, 6–10 and 11–15). The next input signal bin, however, extends from $a_2$ to $a_3$, and contains 10 input signal values. Similarly, the negative input range of $-a_2$ to $-a_3$ also includes ten values, and produces the output value of $-b_2$. Thus, the number of input signal values falling within a bin varies along the characteristic 1010. Characteristic 1010 extends to addresses of $\pm 255$, with as many bins or steps as may be desired. Generally, the size of the bin associated with high-value input address ranges is larger (i.e. bins closer to an absolute output value of 255 contain more input signal values). Each of the output signals of ROM 910 of FIG. 9, including values zero, $b_0$, $b_1$, $b_2$, $b_3 \ldots$ are received by coder 26 of FIG. 2 for encoding. It is extremely inefficient to provide code words for coarsely quantized difference signals which are not produced by quantizer 18. Thus, the ensemble of signals which are accepted by coder 26 (FIG. 2) corresponds exactly with the ensemble of output signals $b_0 \ldots b_3 \ldots$ produced by ROM 910.

Figure 10B:
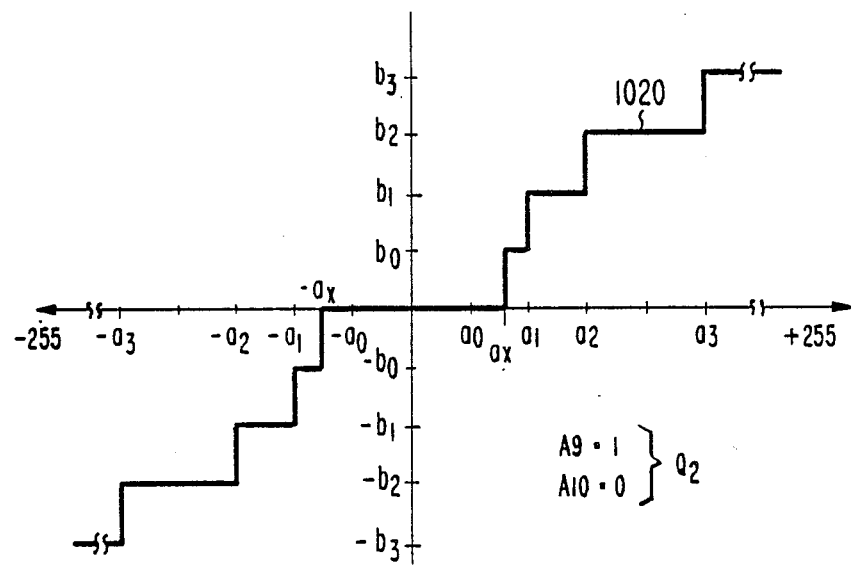

When quantizing law $Q_2$ (FIG. 4) is demanded by fill control 208 (FIG. 2) by causing the signal on conductor 212' (FIG. 3) to take on a logic high condition, ROM 910 receives a logic high at its input terminal $A_9$ which causes selection of a second "page" of the ROM, having a different characteristic, which is illustrated in FIG. 10b. The ordinate and abscissa values of the plot of FIG.

10b are identical to those of FIG. 10a, but characteristic 1020 is different from characteristic 1010. In particular, the coring range in which input signals produce a zero output signal is larger in characteristic 1020 than in characteristic 1010 of FIG. 10a. Characteristic 1020 has a coring region which includes input signal values of $-a_x$ to $a_x$. Input signal $a_x$ may represent the digital value eight, whereupon the coring range contains 17 values ($-8$ to $+8$ including zero) rather than only 11 values as in the ROM page of FIG. 10a. Thus, more values of the input difference signal may be expected to fall within the coring range, and run lengths will tend to be longer, which results in transmission of fewer codewords to rate buffer 28 (FIG. 2). The remainder of characteristic 1020 is identical to characteristic 1010 of FIG. 10a. Thus, the ensemble of output words of law $Q_2$ does not differ from the ensemble of output words of law $Q_1$. Therefore, the data changes are transparent to the receiver. If the values $b_0$ to $b_3$ and $-b_0$ to $-b_3$ shift, then such shifts are not transparent to the receiver and additional apparatus is required at the receiver. Also, codewords need to be sent to the receiver to synchronize such quantizer output values. This detracts from the objective to reduce data.

Figure 10C:
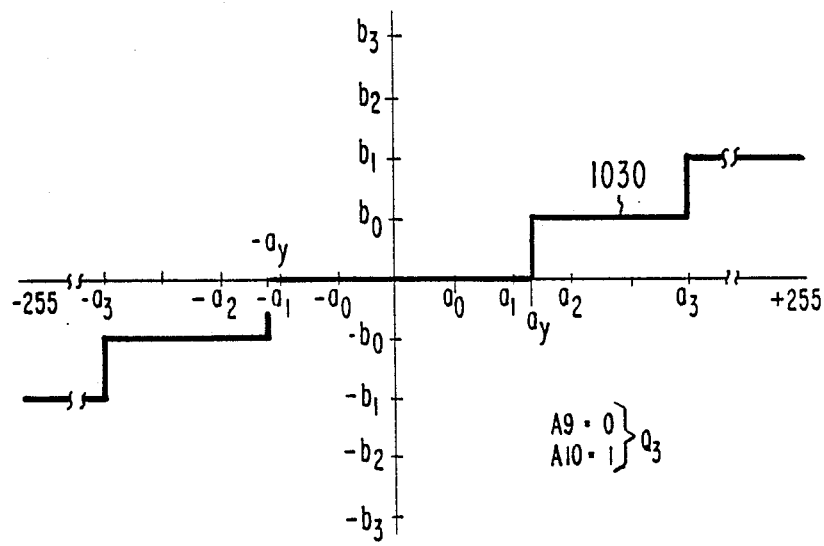

When fill control 208 (FIG. 2) demands coarse quantizing characteristic $Q_3$, it does so by producing a logic high level on conductor 212" (FIG. 3) and a logic low level on conductor 212'. With this combination of page select input addresses at terminals $A_9$ and $A_{10}$, ROM 910 (FIG. 9) selects another set of addresses providing characteristic 1030 as illustrated in FIG. 10c. In FIG. 10c, the ordinate and abscissa values are identical to those of FIGS. 10a and 10b. The coring range extends from $-a_y$ to $a_y$, which encompasses 25 input values ($\pm 12$ and zero). Thus, even more values of input difference signals will fall into the coring range and produce a zero output signal, thereby providing, on the average, even longer zero run lengths and more data compression. It will further be noticed that there is no value of input signal which produces output signals having values $b_2$ or $b_3$. Thus, coarse quantizing characteristic 1030 includes only output values which occur in the complete ensemble of output values zero, $b_0 \ldots b_3 \ldots$ but deletes some values of the ensemble, namely $b_2$ and $b_3$ (and possibly other values which are not illustrated).

This has an effect on the data rate. Since values $b_2$ and $b_3$ do not occur in the ensemble of outputs when using the Q3 characteristic, values such as $b_0$, $b_1$ and the coring value (zero) occur more often. Since values of $b_0$ and $b_1$ occur more often in the Q3 characteristic, they occur more often generally. Values $b_0$ and $b_1$ are represented in the Huffman coding by shorter code words than the values $b_2$ and $b_3$. Thus, when maximum data compression is required and the Q3 characteristic is selected, relatively shorter code words, on the average, are produced by coder 26 of FIG. 2 for application to rate buffer 28 and the shorter codewords result in higher channel throughput and thereby ameliorate the inability to supply words quickly enough to decoder 46 from rate buffer 48 (and from decoder 46) of receiver 238. Furthermore, the fact that quantizing laws, Q1, Q2 and Q3 as illustrated in FIG. 10 all produce the same ensemble of output words (although with deletions for some modes), the ensemble of words to which coder 26 of FIG. 2 responds does not require additions, and overhead need not be used to transmit code change information to decoder 46 of receiver 238. This results in a reduction in the overhead required to be transmitted, which is especially important when increased data compression is requested.

While deletion of certain output values, such as $b_2$ and $b_3$, FIG. 10c, occurs in this example, other values, such as the maximum value $b_3$ may be deleted. Other values can be deleted in the alternative for enlarging the range of difference values in the smallest difference value range corresponding, for example, to value $b_0$. By deleting values $b_2$ and $b_3$, overall distortion is minimized because the probability of the occurrence of difference signals in the range corresponding to values $b_2$ and $b_3$ are low. Also, the words at values $b_2$ and $b_3$ are the longest, thus, dropping such low probability long words from the transmission scheme increases efficiency while minimizing overall distortion.

The term "fill state" as used in the claims, refers to fill rate and fill magnitude of the rate buffer. It should be understood that in the present embodiment, the enlargement of the smallest difference signal value ranges for the value $b_0$ is exemplary. In other implementations, intermediate output values such as $b_1$ or $b_2$ may be enlarged for certain transmission requirements.

What is claimed is:

1. A transmitter for processing information signals to obtain digital codewords for transmission through a channel to a receiver, said transmitter comprising:

subtracting means for subtracting predicted signals from said information signals for generating difference signals having a plurality of values;

quantizing means responsive to said difference signal values applied thereto for, in all operating modes out of a plurality of operating modes organizing the values of said difference signals into a plurality of sets of ranges of values, each value of said difference signals corresponding to only one of said ranges of values of a given set, each difference signal causing said quantizing means to produce a given output signal value corresponding to the range of that difference signal, and for, in a first operating mode of said plurality of operating modes representing a first quantizing characteristic, producing a first ensemble of given output signal values for classifying all possible values of difference signals in a first set of ranges, each given output signal value representing a different range in a set, and for, in all of said plurality of operating modes other than said first operating mode representing at least a second further quantizing characteristic, producing for each further quantizing characteristic, a respective ensemble of output signal values which are the same as at least a portion of said first ensemble given output signal values, each said respective ensemble being ordinarily numbered in correspondence with the further quantizing characteristic with which it is associated, each said respective ensemble containing no output signal values different than the first ensemble output signal values in response to all possible values of said difference signals, insofar as each further quantizing characteristic being concerned for classifying difference signals in sets of ranges other than said first set of ranges to thereby produce quantized signals each value of which is represented by one of said given output signal values;

adding means coupled to said quantizing means for adding said predicted signals to said quantized signals for producing sum signals;

prediction means coupled to said adding means, and to said subtracting means for processing said sum signals for producing a said predicted signals, said processing including signal delay;

coding means responsive only to values of said quantized signals included within said first and at least further ensembles, for sequentially generating said digital codewords, said coding means being of a type generating digital codewords having a bit rate that is subject to variation; and means for selecting the mode of operation of said quantizing means among said plurality of operating modes, whereby the quantizing can be changed thereby to adjust the information rate in said sequentially generated digital codewords to be within an acceptable range.

2. The transmitter of claim 1 wherein said means for selecting the mode of operation of said quantizing means includes buffer memory means for receiving and temporarily storing said codewords and for causing said codewords to be transmitted over said channel at a given constant rate, said buffer memory means emptying at said information rate of transmission and filling at a fill rate that corresponds to the information rate of sequentially generated digital codewords; and control means responsive to the rate of fill or the amount of information temporarily stored in said buffer memory means, or fill state, for selecting one of said operating modes most likely to maintain within acceptable bounds the amount of information temporarily stored within said buffer memory means.

3. The transmitter of claim 2 wherein said quantizing means includes a plurality page storage means, each page storage means manifesting a separate, different quantizing characteristic and having a unique corresponding address, said control means including means responsive to the fill rate and the fill level rate of said buffer memory means for generating a plurality of quantizing means address signals, each address signal representing a unique combination of said fill rate and fill level of said buffer memory means.

4. The transmitter of claim 1 wherein said quantizing means includes means for assigning first and second input ranges for a first output signal such that in said first operating mode values said first set of ranges of difference signal values includes for the smallest values of said difference signals in said first assigned input range, a first output signal value of a given magnitude, and in a second operating mode said first output signal value corresponds to said second assigned input range for the smallest values of said difference signals, said second assigned input range not only includes the values of difference signals in the first assigned input range, but also includes larger values of difference signals smaller than a prescribed value.

5. The transmitter of claim 4 wherein said quantizer means includes means for assigning a third input range such that in a third operating mode said third assigned input range for said difference signal values not only includes the values of difference signals in said same assigned input range but also includes larger values of difference signals smaller than a prescribed value, and wherein said third assigned signal range for said difference signal values has an output signal value the same as the output signal value as one output value of said second assigned input range.

6. The transmitter of claim 5 wherein said first set of ranges of difference signals correspond to an ensemble of m output signal values, said third operating mode having a second set of ranges of difference-input signals corresponding to an ensemble m-n output signal values where n is an integer, said one output value corresponds to said third assigned input range.

7. The transmitter of claim 1 wherein in a second operating mode the input values in each range of a given set of ranges of input values correspond to a set of output signals values smaller in number than the set of output signal values of the first operating mode, the output signal values of the first and second operating modes being the same.

8. The transmitter of claim 1 wherein said means for selecting the mode of operation of said quantizing means includes:

buffer memory means coupled at least to said coding means adapted for receiving codewords for temporarily storing signals and for producing said stored signals at an output terminal;

rate control signal generating means responsive to the fill conditions in said buffer memory means for generating a first control signal at least partially representative of the fill rate of said buffer memory means; and control means responsive to said first control signal for changing the operating mode of the quantizing means to control the number of bits at which signals are applied to said buffer memory means for controlling the rate of fill of said buffer memory means.

9. The transmitter of claim 8 wherein said rate control signal generating means includes means for generating a plurality of control signals each representing a different fill state of the buffer memory means, said control means being responsive to said control signals for selecting that operating mode most likely to maintain within acceptable bounds the amount of information temporarily stored within said buffer memory means.

10. The transmitter of claim 1, wherein said means for selecting the mode of operation of said quantizing means further comprises:

buffer memory means coupled to said coding means for receiving said coded signals therefrom for temporarily storing said coding signals at memory locations identified by sequential write addresses, and for reading said coded signals from memory locations identified by sequential read addresses;

first differencing means coupled to said buffer memory means for taking the difference between currently active read and write address to generate a fill-representative signal;

delay means coupled to said first differencing means for receiving said fill-representative signals therefrom for generating delayed fill-representative signals;

second differencing means coupled to said first differencing means and to said delay means for taking the difference between said fill-representative signals and said delayed fill-representative signals to produce a rate signal representative of the rate at which said buffer memory is filling; and means for applying said rate signal to said quantizing means for selecting the operating mode in accordance with the rate at which said buffer is filling.

11. The transmitter of claim 10 further comprising combining means responsive to said first and second differencing means for combining said rate signal and said fill-representative signals to produce a control signal, and applying said control signal to said quantizing means for selecting said operating mode.

12. In a transmitter for processing information signals for digital transmission through a channel at a given rate to a receiver, a quantizing system comprising:

subtracting means for subtracting predicted signals from said information signals to generate difference signals having a plurality of values;

quantizing means having a plurality of operating modes and responsive to said difference signals applied thereto for generating output signal values chosen from a set of possible quantized output signal values, at least one of the output signal values corresponding to a plurality of different ranges of the difference signal values in accordance with which of a plurality of said operating modes of the quantizing means is selected, each operating mode corresponding to a differently selected set of difference signal value ranges, the output signal values for each selected set of difference signal value ranges being contained within said set of possible quantized output signals irrespective of the change in size of the difference signal value ranges for a given operating mode;

buffer memory means coupled to said quantizing means for receiving quantized signals therefrom for temporarily storing the quantized signals, said buffer means tending to undesirably overfill and underfill; and control means responsive to the fill state of said buffer means for generating a control signal representing a given fill state and an operating mode and for applying said control signal to said quantizing means to select an operating mode and change the correspondence of the difference signal ranges to given output signal values in such a way as to reduce the rate of fill of said buffer memory means.

13. The quantizing system of claim 12 wherein said control means includes means responsive to the rate of fill of said buffer and the magnitude of fill of the buffer to generate said control signal.

14. The quantizing system of claim 12 wherein said set of output signal values of each operating mode have different quantized coarseness, said quantizing means including at least one ROM having a plurality of memory storage places and address means for dividing said storage places into a plurality of range values, said control signal including means for addressing a given range in accordance with the coarseness of the desired quantization.

15. The quantization system of claim 12 wherein said quantization means includes a plurality of quantization laws, each law corresponding to a given set of output signals, at least one law having a set of output signals fewer in number than and that are a subset of the set of output signals in a second law.

16. The quantization system of claim 15 wherein said at least one law has a quantizing characteristic in which the difference signals of the smallest values have a larger range than the range of the smallest difference signal values of any of the other laws.

17. The quantizing system of claim 15 wherein said at least one law includes a set of output signal values such that the maximum output value for this law is smaller than the maximum output value of any of the remaining laws.

* * * * *